(12) United States Patent
Mizugaki

(10) Patent No.: US 11,097,667 B2
(45) Date of Patent: Aug. 24, 2021

(54) VIBRATION DEVICE, VIBRATION MODULE, ELECTRONIC APPARATUS, AND VEHICLE

(71) Applicant: SEIKO EPSON CORPORATION, Tokyo (JP)

(72) Inventor: Koichi Mizugaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/728,368

(22) Filed: Dec. 27, 2019

(65) Prior Publication Data
US 2020/0207283 A1 Jul. 2, 2020

(30) Foreign Application Priority Data

Dec. 28, 2018 (JP) .............................. JP2018-248212

(51) Int. Cl.
| | |
|---|---|
| *B60R 11/02* | (2006.01) |
| *G06F 3/16* | (2006.01) |
| *G06F 1/04* | (2006.01) |
| *G06F 1/16* | (2006.01) |
| *G06F 3/01* | (2006.01) |
| *G10K 9/122* | (2006.01) |
| *B06B 1/02* | (2006.01) |
| *H03B 5/36* | (2006.01) |
| *H03H 9/05* | (2006.01) |
| *H03H 9/10* | (2006.01) |

(52) U.S. Cl.
CPC .......... *B60R 11/0235* (2013.01); *G10K 9/122* (2013.01); *G06F 1/1605* (2013.01); *G06F 3/16* (2013.01)

(58) Field of Classification Search
USPC ......................................................... 348/837
See application file for complete search history.

(56) References Cited

U.S. PATENT DOCUMENTS

| | | |
|---|---|---|
| 2014/0306328 A1 | 10/2014 | Mikado et al. |
| 2017/0134004 A1 | 5/2017 | Isozaki et al. |
| 2018/0076790 A1 | 3/2018 | Kojo et al. |

FOREIGN PATENT DOCUMENTS

| | | |
|---|---|---|
| JP | 2006-339896 A | 12/2006 |
| JP | 2011-049992 A | 3/2011 |
| JP | 2013-026761 A | 2/2013 |
| JP | 2013-026919 A | 2/2013 |
| JP | 2014-225643 A | 12/2014 |
| JP | 2015-211399 A | 11/2015 |
| JP | 2017-092698 A | 5/2017 |
| WO | 2016/158010 A1 | 10/2016 |

*Primary Examiner* — Patricia I Young
(74) *Attorney, Agent, or Firm* — Oliff PLC

(57) ABSTRACT

A vibration device includes a first substrate including a first surface and a second surface opposite to the first surface; a second substrate including a third surface bonded to the second surface thereby forming an accommodation space between the first substrate and the second substrate, and a fourth surface opposite to the third surface; a vibration element accommodated in the accommodation space; and a first external coupling terminal arranged at the fourth surface and having a first position to where a first wire to be coupled. The first position being within an area overlapping a bonding area between the first substrate and the second substrate, as viewed in a plan view.

20 Claims, 19 Drawing Sheets

VIBRATION DEVICE, VIBRATION MODULE, ELECTRONIC APPARATUS, AND VEHICLE

The present application is based on, and claims priority from JP Application Serial Number 2018-248212, filed Dec. 28, 2018, the disclosure of which is hereby incorporated by reference herein in its entirety.

BACKGROUND

1. Technical Field

The present disclosure relates to a vibration device, a vibration module, an electronic apparatus, and a vehicle.

2. Related Art

A vibration device described in JP-A-2011-49992 has a substrate, a piezoelectric element installed at one surface of the substrate, and a lid bonded to the one surface of the substrate so as to accommodate the piezoelectric element. JP-A-2011-49992 discloses that an external electrode electrically coupled to the piezoelectric element is provided at the other surface of the substrate and that a bonding wire is coupled to the external electrode.

In the vibration device described in JP-A-2011-49992, the lid and the substrate are bonded together, thus forming a space to accommodate a vibration element inside a package. At a position overlapping this space as viewed in a plan view, the bonding wire is coupled to the external electrode. Therefore, the package of the vibration device tends to be damaged by the stress of coupling the bonding wire to the external electrode.

SUMMARY

A vibration device according to an aspect of the present disclosure includes: a first substrate including a first surface and a second surface opposite to the first surface; a second substrate including a third surface bonded to the second surface and a fourth surface opposite to the third surface; a vibration element accommodated in an accommodation space formed between the first substrate and the second substrate as the third surface is bonded to the second surface; and a first external coupling terminal arranged at the fourth surface and having a first wire coupled thereto. A position where the first wire is coupled is within an area overlapping a bonding area between the first substrate and the second substrate, as viewed in a plan view.

A vibration device according to another aspect of the present disclosure includes: a first substrate; a second substrate; an intermediate substrate arranged between the first substrate and the second substrate and including a vibration element and a frame surrounding the vibration element; and a first external coupling terminal arranged at a surface opposite to a surface at the side of the intermediate substrate of the second substrate and having a first wire coupled thereto. The frame has one surface bonded to the first substrate and has the other surface bonded to the second substrate. A position where the first wire is coupled is within an area overlapping a bonding area between the first substrate and the frame and a bonding area between the second substrate and the frame, as viewed in a plan view.

In the vibration device according to another aspect of the present disclosure, the second substrate may be a semiconductor substrate and may have an oscillation circuit electrically coupled to the vibration element.

A vibration module according to another aspect of the present disclosure includes: the foregoing vibration device; and a module component to which the vibration device is attached via the first surface.

An electronic apparatus according to another aspect of the present disclosure includes: the foregoing vibration device; and an arithmetic processing device operating, based on an oscillation signal outputted from the oscillation circuit.

A vehicle according to another aspect of the present disclosure includes: the foregoing vibration device; and an arithmetic processing device operating, based on an oscillation signal outputted from the oscillation circuit.

DESCRIPTION OF EXEMPLARY EMBODIMENTS

A vibration device, a vibration module, an electronic apparatus, and a vehicle according to an aspect of the present disclosure will now be described in detail, based on embodiments illustrated in the accompanying drawings.

First Embodiment

Figure 1:
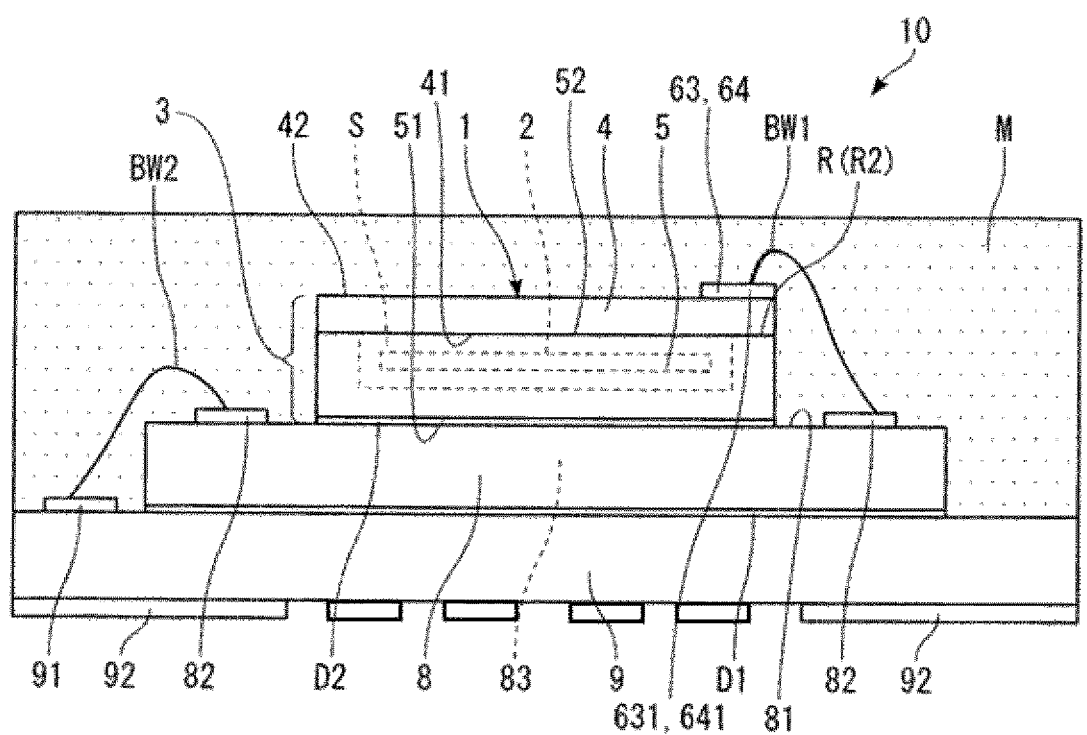
FIG. 1 is a cross-sectional view showing a vibration module according to a first embodiment.
Figure 1:
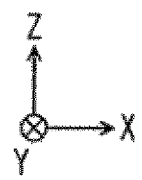
Figure 2:
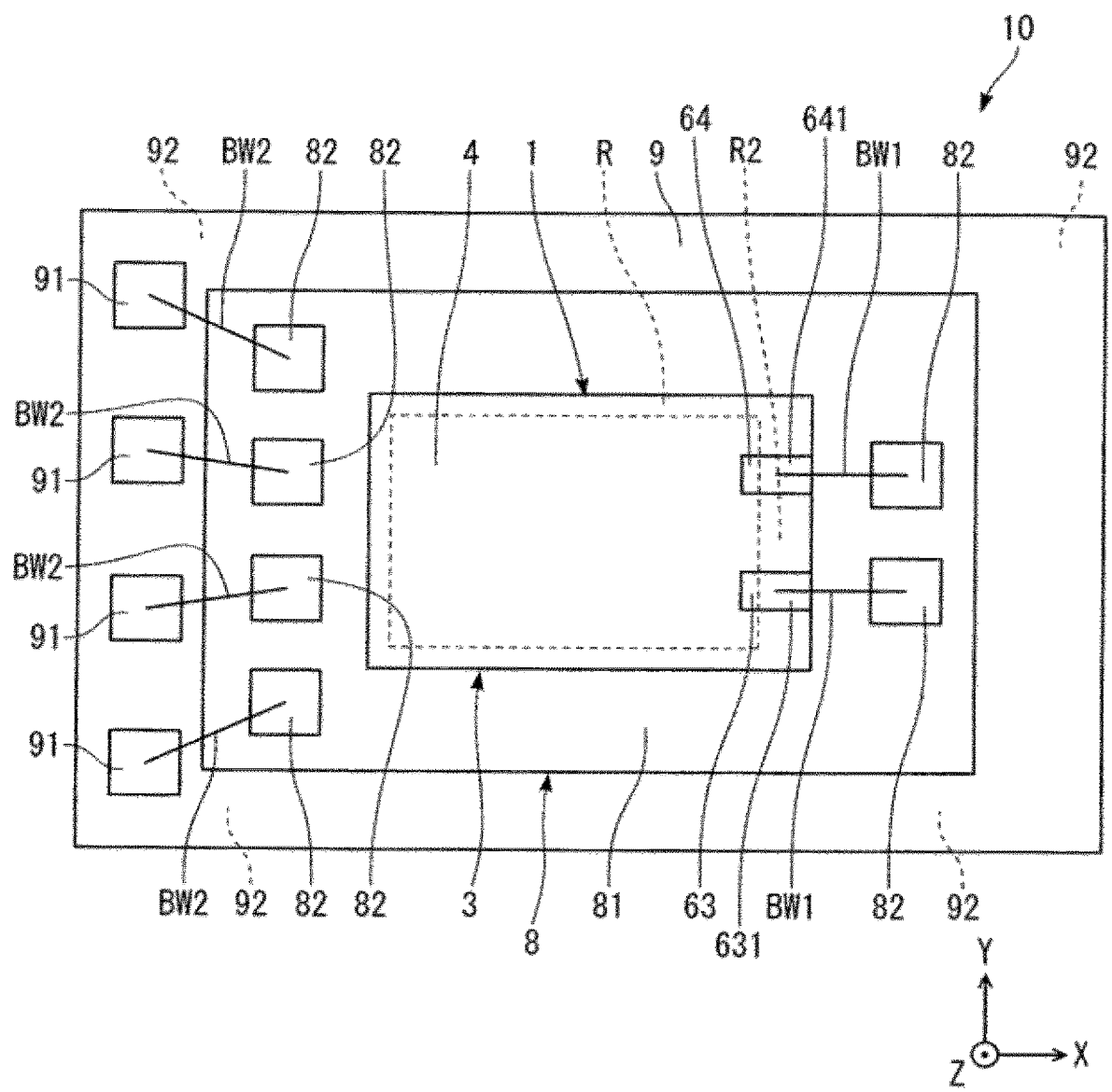
FIG. 2 is a plan view of the vibration module shown in FIG. 1.
Figure 3:
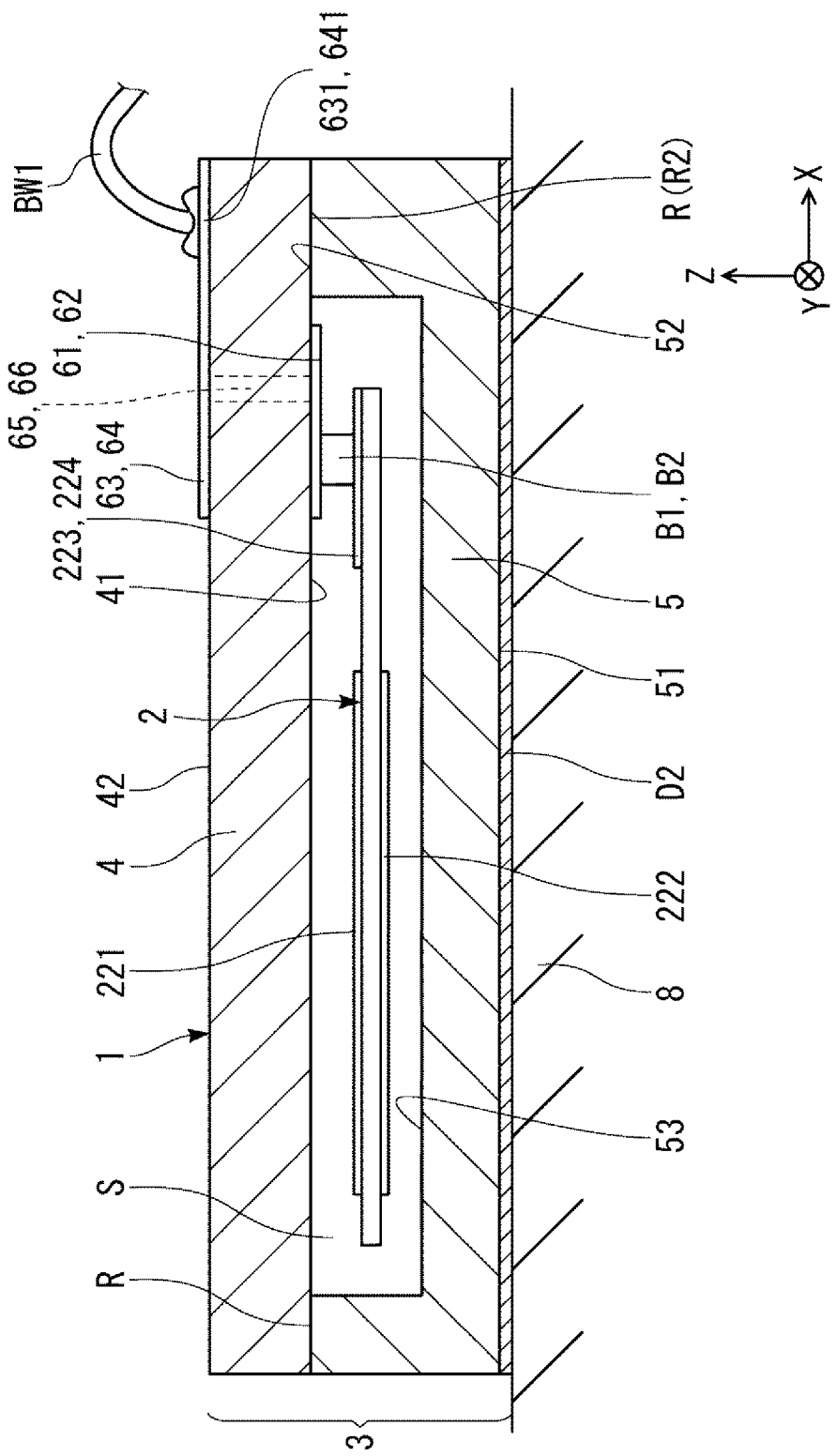
FIG. 3 is a cross-sectional view taken along a Y-axis of a vibration device provided in the vibration module.
Figure 4:
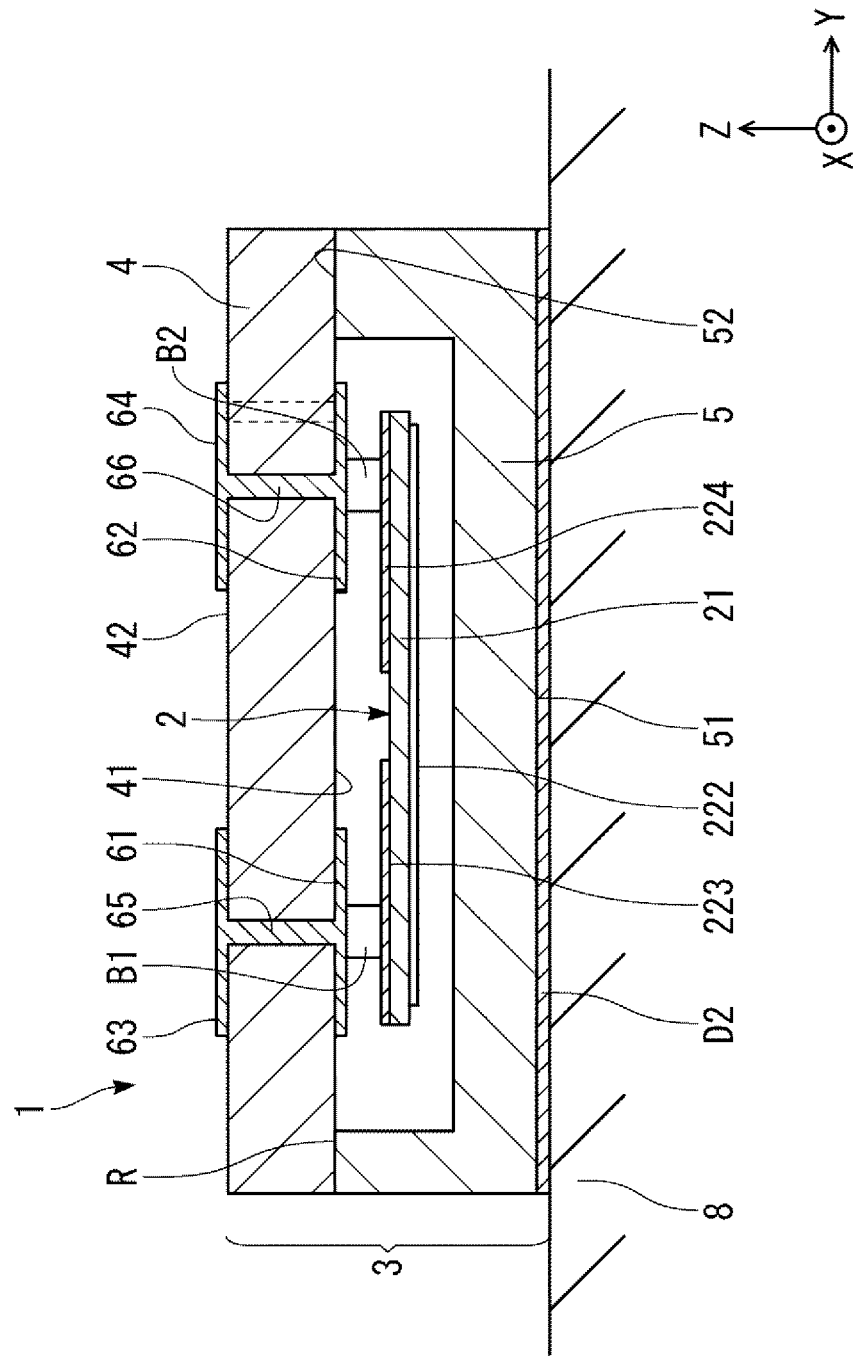
FIG. 4 is a cross-sectional view taken along an X-axis of the vibration device provided in the vibration module.
Figure 5:
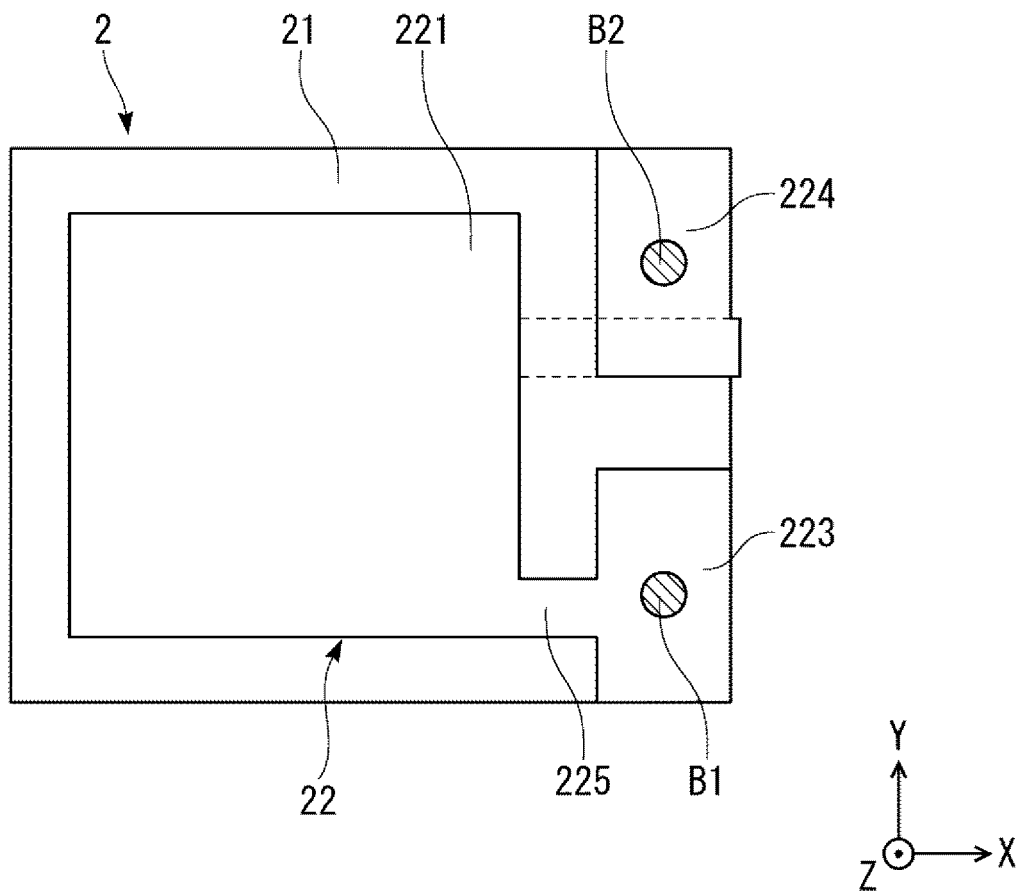
FIG. 5 is a top view showing a vibration element provided in the vibration device.
Figure 6:
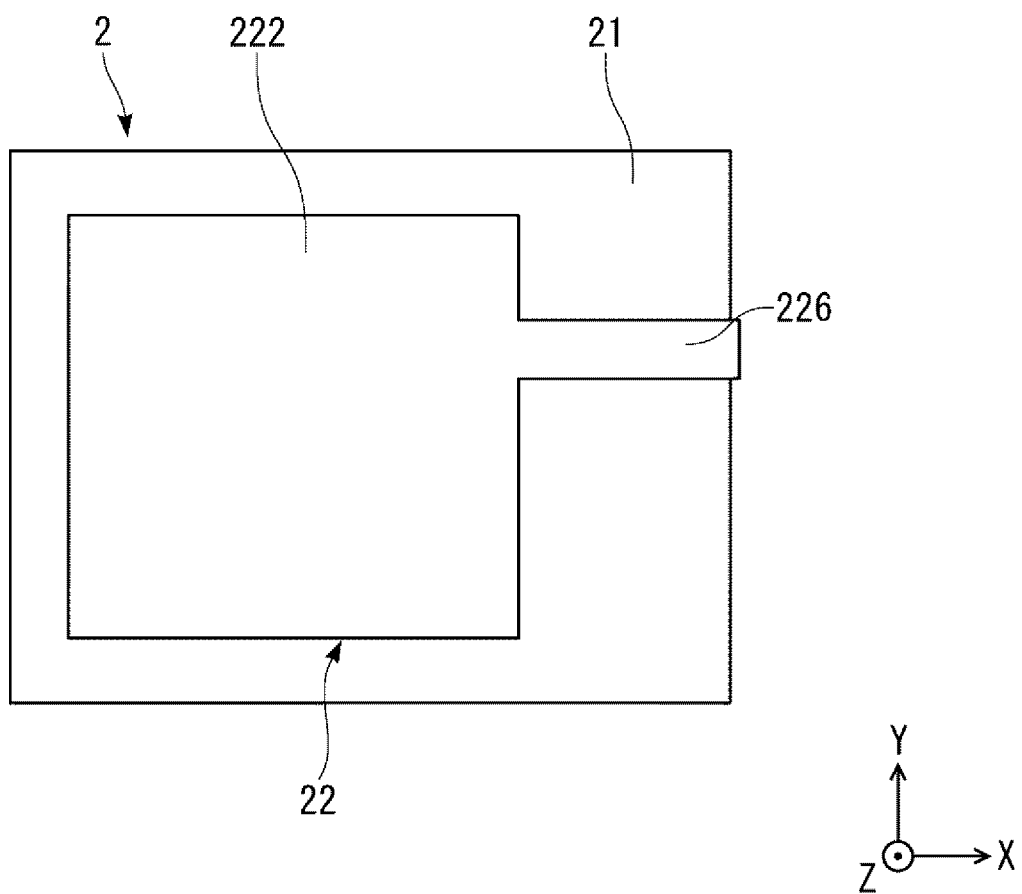
FIG. 6 is a perspective view of a bottom surface of the vibration element, as viewed from above.
Figure 7:
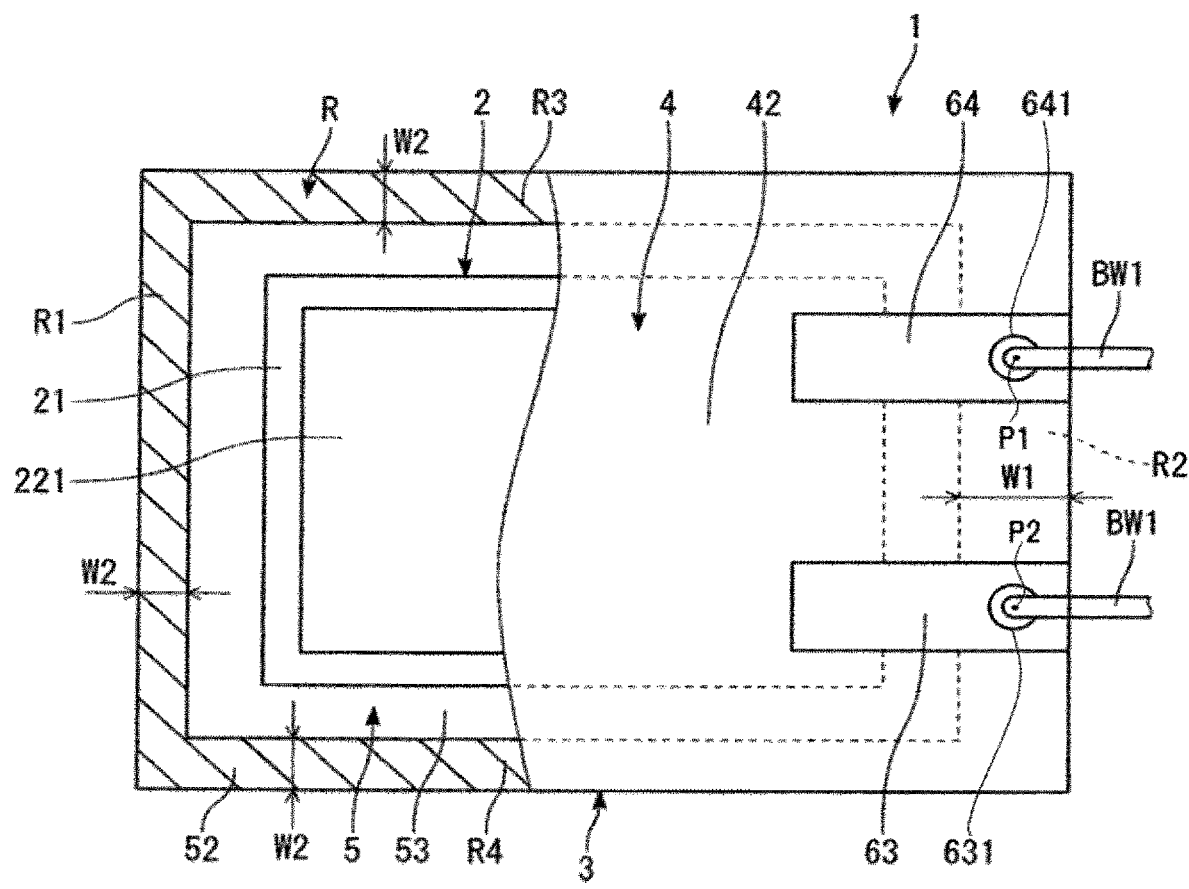
FIG. 7 is a plan view of the vibration device.
Figure 7:
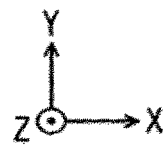
Figure 8:
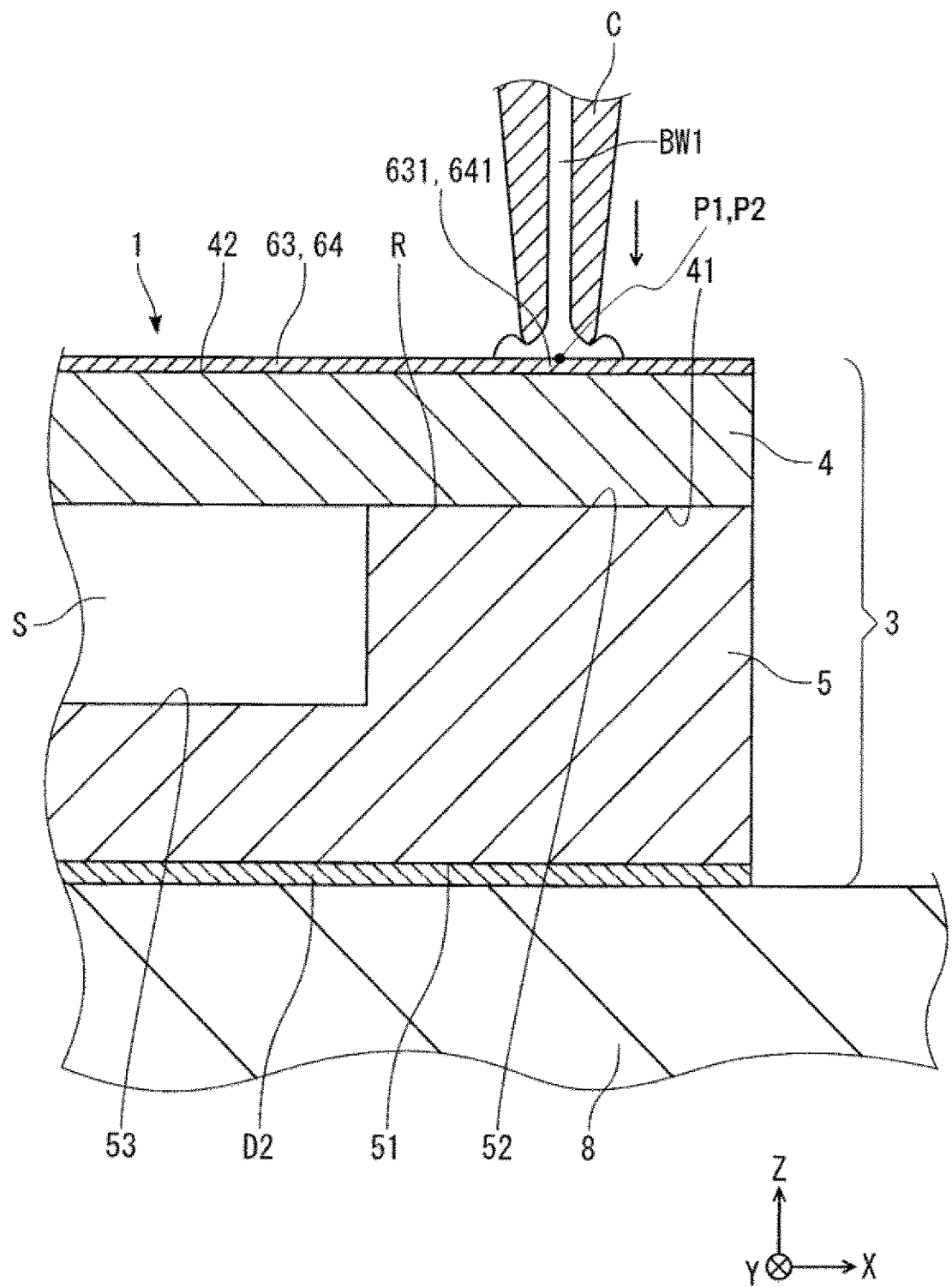
FIG. 8 is a cross-sectional view showing the state where a capillary is pressed against a package.

FIG. 1 is a cross-sectional view showing a vibration module according to a first embodiment. FIG. 2 is a plan view of the vibration module shown in FIG. 1. FIG. 2 shows the vibration module where a molding member M is omitted for the sake of description. FIG. 3 is a cross-sectional view taken along a Y-axis of a vibration device provided in the vibration module. FIG. 4 is a cross-sectional view taken along an X-axis of the vibration device provided in the vibration module. FIG. 5 is a plan view showing a vibration element provided in the vibration device, as viewed in a direction from the positive side to the negative side on a Z-axis in FIG. 1. FIG. 6 is a perspective view showing the vibration element, as viewed in the direction from the positive side to the negative side on the Z-axis in FIG. 1. FIG. 7 is a plan view of the vibration device. FIG. 8 is a cross-sectional view showing the state where a capillary is pressed against the package of the vibration module. Hereinafter, for the sake of convenience of the description, the positive side on the Z-axis in FIG. 1 is also referred to as "up" and the negative side on the Z-axis is also referred to as "down". As three axes orthogonal to each other, X-axis, Y-axis, and Z-axis are employed. The term "as viewed in a plan view" means that something is viewed in a plan view taken in the direction of thickness of the substrate, that is, along the Z-axis.

A vibration module 10 shown in FIG. 1 has a support substrate 9, circuit board 8 installed at the support substrate 9, a vibration device 1 installed at the circuit board 8, a wire BW1 electrically coupling the circuit board 8 and the vibration device 1 together, a wire BW2 electrically coupling the support substrate 9 and the circuit board 8 together, and a molding member M molding the circuit board 8 and the vibration device 1. In this embodiment, the support substrate 9 and the circuit board 8 are equivalent to the "module component".

Support Substrate

The support substrate 9 is a substrate supporting the circuit board 8 and the vibration device 1. For example, the support substrate 9 is an interposer substrate. As shown in FIG. 2, a plurality of coupling terminals 91 is arranged at a top surface of the support substrate 9. A plurality of mounted terminals 92, not illustrated, is arranged at a bottom surface. An internal wiring, not illustrated, is arranged inside the support substrate 9. Each coupling terminal 91 is electrically coupled to the corresponding mounted terminal 92 via this internal wiring. The material of such a support substrate 9 may be any insulative material. For example, silicon, ceramic, resin, glass, glass epoxy and the like can be used.

Circuit Board

As shown in FIG. 1, the circuit board 8 is bonded to the top surface of the support substrate 9 via a die attach member D1 functioning as an adhesive. The circuit board 8 is a semiconductor substrate. Atop surface of the circuit board 8 is an active surface 81. A plurality of terminals 82 is arranged at the active surface 81, as shown in FIG. 2. The circuit board 8 has an oscillation circuit 83 causing a vibration element 2 provided in the vibration device 1 to oscillate and thus generating a reference signal such as a clock signal. Other than the oscillation circuit 83, the circuit board 8 may also have another circuit such as a temperature compensation circuit correcting the frequency of the reference signal generated by the oscillation circuit 83, based on the temperature of the vibration element 2.

Vibration Device

As shown in FIG. 3, the vibration device 1 is bonded to the active surface 81 of the circuit board 8 via a die attach member D2 functioning as an adhesive. Also, the vibration device 1 has the vibration element 2 and a package 3 accommodating the vibration element 2. The package 3 has an accommodation space S inside and accommodates the vibration element 2 in this accommodation space S. Therefore, the package 3 can suitably protect the vibration element 2 from impact, dust, heat, moisture and the like. Such a package 3 has a base substrate 4 as a second substrate supporting the vibration element 2, and a lid substrate 5 as a first substrate bonded to the base substrate 4 so as to form the accommodation space S between the lid substrate 5 and the base substrate 4.

The lid substrate 5 has a plate-like shape including a bottom surface 51 as a first surface and a top surface 52 as a second surface opposite to the bottom surface 51. The lid substrate 5 also has a recess 53 opening to the side of the top surface 52. Meanwhile, the base substrate 4 has a plate-like shape including a bottom surface 41 as a third surface and a top surface 42 as a fourth surface opposite to the bottom surface 41. The bottom surface 41 of the base substrate 4 is bonded to the top surface 52 of the lid substrate 5 in such a way that the base substrate 4 closes the opening of the recess 53. As the base substrate 4 closes the opening of the recess 53, the accommodation space S is formed and the vibration element 2 is accommodated in the accommodation space S. The accommodation space S is in an air-tight pressure-reduced state, preferably, a state close to vacuum. Thus, the vibration element 2 can be driven stably. However, the atmosphere in the accommodation space S is not particularly limited and may be, for example, an atmosphere enclosing an inert gas such as nitrogen or argon, and may be an atmospheric-pressure state instead of the pressure-reduced state.

Each of the lid substrate 5 and the base substrate 4 is formed of a silicon substrate. The lid substrate 5 and the base substrate 4 are directly bonded together by the surface activated bonding method. Specifically, an inert gas such as argon is blown against the top surface 52 of the lid substrate 5 and the bottom surface 41 of the base substrate 4 and thus activates the surfaces. The top surface 52 and the bottom surface 41, thus activated, are bonded together. The surface activated bonding method can bond the lid substrate 5 and the base substrate 4 together at room temperature and therefore makes it less likely for the stress to remain on the package 3. Also, since the lid substrate 5 and the base substrate 4 can be bonded together without using a bonding member such as an adhesive or metal film, the height of the package 3 can be reduced.

Hereinafter, the area where the lid substrate 5 and the base substrate 4 are bonded together is referred to as a bonding area R. As shown in FIG. 7, the bonding area R has a rectangular frame-like shape surrounding the vibration element 2, as viewed in a plan view of the lid substrate 5.

As shown in FIG. 4, a pair of internal coupling terminals 61, 62 is arranged at the bottom surface 41 of the base substrate 4, and a pair of external coupling terminals 63, 64 is arranged at the top surface 42. Also, a pair of through electrodes 65, 66 penetrating from the top surface 42 to the bottom surface 41 is arranged in the base substrate 4. The through electrode 65 electrically couples the internal coupling terminal 61 and the external coupling terminal 63 together. The through electrode 66 electrically couples the internal coupling terminal 62 and the external coupling terminal 64. As will be described later, the internal coupling terminals 61, 62 are electrically coupled to the vibration element 2 via electrically conductive bumps B1, B2. The external coupling terminals 63, 64 are electrically coupled to the terminals 82, 82 formed at the active surface 81 of the circuit board 8 via the wire BW1. In FIG. 2, the other terminals 82 shown on the negative side on the X-axis from the vibration device 1 in FIG. 2 are coupled to the coupling terminals 91 formed at the top of the support substrate 9 via the wire BW2.

The package 3 has been described above. The package 3 is arranged with the bottom surface 51 of the lid substrate 5 facing downward, that is, facing the side of the circuit board 8. The bottom surface 51 of the lid substrate 5 is bonded to the active surface 81 of the circuit board 8 via the die attach member D2. That is, the top surface 42 of the base substrate 4, where the external coupling terminals 63, 64 are arranged, faces upward of the vibration module 10.

The vibration element 2 has a vibrating substrate 21 formed of a quartz crystal substrate, and an electrode 22 arranged at a surface of the vibrating substrate 21, as shown in FIGS. 5 and 6. The vibrating substrate 21 has a thickness-shear vibration mode. In this embodiment, the vibrating substrate 21 is formed of an AT-cut quartz crystal substrate. The AT-cut quartz crystal substrate has a tertiary frequency-temperature characteristic. Therefore, forming the vibrating substrate 21 of the AT-cut quartz crystal substrate provides the vibration element 2 with an excellent temperature characteristic.

The electrode 22 has an excitation electrode 221 arranged at a top surface of the vibrating substrate 21, and an excitation electrode 222 arranged at a bottom surface of the vibrating substrate 21 and opposite the excitation electrode 221. The electrode 22 also has a pair of terminals 223, 224 arranged at the top surface of the vibrating substrate 21, a wiring 225 electrically coupling the terminal 223 and the excitation electrode 221 together, and a wiring 226 electrically coupling the terminal 224 and the excitation electrode 222 together. Applying a drive signal between the excitation electrodes 221, 222 via the terminals 223, 224 causes the vibrating substrate 21 to perform thickness-shear vibration.

The vibration element 2 is fixed to the bottom surface 41 of the base substrate 4 via a pair of electrically conductive bumps B1, B2. The terminal 223 of the vibration element 2 and the internal coupling terminal 61 of the base substrate 4 are electrically coupled together via the bump B1. The terminal 224 of the vibration element 2 and the internal coupling terminal 62 of the base substrate 4 are electrically coupled together via the bump B2.

The bumps B1, B2 are not particularly limited, provided the bumps B1, B2 have electrically conductivity and bonding ability. For example, it is preferable to use various metal bumps such as gold bump, silver bump, copper bump, and solder bump. This can reduce the outgassing from the bumps B1, B2 and can effectively restrain environmental changes in the accommodation space S, particularly, a rise in pressure.

The vibration element 2 has been described above. However, the configuration of the vibration element 2 is not limited to the above configuration. For example, the vibration element 2 may be a mesa-type in which a vibration area between the excitation electrodes 221, 222 protrudes from its periphery, or an inverted mesa-type in which the vibration area is depressed from its periphery. Also, beveling to shave off the periphery of vibrating substrate 21, or convexing to form the top surface and the bottom surface into convex curved surfaces may be performed.

The vibration element 2 is not limited to the vibration element vibrating in the thickness-shear vibration mode. For example, a tuning fork-type vibration element in which a plurality of vibrating arms performs bending vibration in an in-plane direction, a tuning fork-type vibration element in which a plurality of vibrating arms performs bending vibration in an out-of-plane direction, a gyro sensor element which has a drive arm performing drive vibration and a detection arm performing detection vibration and which detects an angular velocity, or an acceleration sensor element which has a detector detecting an acceleration may be employed. The vibrating substrate 21 is not limited to the vibrating substrate formed of the AT-cut quartz crystal substrate. The vibrating substrate 21 may be formed of a quartz crystal substrate other than the AT-cut quartz crystal substrate, for example, an X-cut quartz crystal substrate, Y-cut quartz crystal substrate, Z-cut quartz crystal substrate, BT-cut quartz crystal substrate, SC-cut quartz crystal substrate, ST-cut quartz crystal substrate, and the like. Also, the vibration element 2 is not limited to the piezoelectrically driven vibration element and may be an electrostatically driven vibration element using an electrostatic force.

In this embodiment, the vibrating substrate 21 is formed of a quartz crystal. However, the material forming the vibrating substrate 21 is not limited to this. For example, the vibrating substrate 21 may be formed of a piezoelectric single crystal material of lithium niobate, lithium tantalate, lithium tetraborate, langasite, potassium niobate, gallium phosphate or the like, or may be formed of other piezoelectric single crystal materials than these.

Back to the description of the package 3, the external coupling terminals 63, 64 arranged at the top surface 42 of the base substrate 4 will now be described in detail. As shown in FIGS. 1, 2, and 7, the external coupling terminals 63, 64 have wire coupling areas 631, 641 to which the electrically conductive wire BW1 as a bonding wire is coupled. The external coupling terminals 63, 64 are coupled to the wire BW1 at positions P1, P2 of the wire coupling areas 631, 641. The positions P1, P2 are arranged in an area overlapping the bonding area R, as viewed in a plan view of the base substrate 4. In this embodiment, the positions P1, P2 are the center positions of the wire coupling areas 631, 641.

In such a configuration, the positions P1, P2 coupled to the wire BW1 in the external coupling terminals 63, 64 are located at sites where a highly rigid part made up of the base substrate 4 and the lid substrate 5 continuously laid on top of each other is arranged between the positions P1, P2 and the circuit board 8. That is, a gap such as the accommodation space S is not provided between the positions P1, P2 coupled to the wire BW1 and the circuit board 8. Therefore, even when a capillary C is pressed against the external coupling terminals 63, 64 in order to couple the wire BW1 to the external coupling terminals 63, 64, and this applies a stress to the package 3, as shown in FIG. 8, the package 3 is less likely to be damaged. Also, even when a silicon substrate or glass substrate which is more fragile than a ceramic substrate formed of alumina ($Al_2O_3$) or the like is used as the base substrate 4, the package 3 is less likely to be damaged. When ultrasonic waves are used to couple the wire BW1 to the external coupling terminals 63, 64, the ultrasonic waves can be applied more efficiently to the wire coupling areas 631, 641 from the capillary C. This increases the bonding strength between the wire coupling areas 631, 641 and the wire BW1 and enables a more secure and firm coupling between these parts. Therefore, the electrical properties of the vibration module 10 are stabilized.

The wire coupling areas 631, 641 may be arranged preferably in an area overlapping the bonding area R, as viewed in a plan view of the base substrate 4. Such a configuration can achieve the state where a gap such as the accommodation space S is not provided between the wire coupling areas 631, 641 and the circuit board 8, over the entire wire coupling areas 631, 641. Therefore, even when the capillary C is pressed against the external coupling terminals 63, 64 and this applies a stress to the package 3, the package 3 is even less likely to be damaged.

In the illustrated configuration, first bonding (ball bonding) is performed on the side of the external coupling terminals 63, 64 and second bonding (wedge bonding) is performed on the side of the terminal 82. However, this is not limiting and the reverse may be employed. That is, the first bonding (ball bonding) may be performed on the side of the terminal 82 and the second bonding (wedge bonding) may be performed on the side of the external coupling terminals 63, 64. Particularly, wedge bonding the side of the external coupling terminals 63, 64 can restrain the height of the wire BW1 and can reduce the thickness of the vibration module 10 accordingly, compared with this embodiment.

As the method for coupling the wire BW1 to the external coupling terminals 63, 64, for example, an ultrasonic method using an aluminum wire as the wire BW1, a thermocompression bonding method using a gold wire as the wire BW1, or an ultrasonic-thermocompression bonding method using both ultrasonic waves and thermocompression bonding, can be used.

As described above, the bonding area R has a rectangular frame-like shape surrounding the vibration element 2, as viewed in a plan view of the base substrate 4. Therefore, the bonding area R has four extensions R1 to R4 along the respective sides, as shown in FIG. 7. The extensions R3, R4, parallel to each other, extend along the long axis of the rectangle. The extensions R1, R2, parallel to each other, extend along the short axis of the rectangle. The wire coupling areas 631, 641 of the external coupling terminals 63, 64 are arranged in such a way as to overlap the extension R2, which is one of the extensions R1, R2, R3, R4, as viewed in a plan view of the base substrate 4.

Since the wire coupling areas 631, 641 of the external coupling terminals 63, 64 are arranged in such a way as to overlap the one extension R2, it suffices to secure a space to arrange the wire coupling areas 631, 641 only at the extension R2 and there is no need to secure such a space at the other three extensions R1, R3, R4. Therefore, the width of the extensions R1, R3, R4 can be made narrower and the bonding area R can be made smaller. Thus, the package 3 can be miniaturized. However, this is not limiting. The wire coupling areas 631, 641 may be arranged separately at two extensions selected from among the extensions R1 to R4.

A width W1 of the extension R2 is greater than a width W2 of each of the other three extensions R1, R3, R4. That is, W1>W2. Such a relationship increases the area overlapping the extension R2 and makes it easier to arrange the wire coupling areas 631, 641. Also, since the width W2 of the extensions R1, R3, R4 is narrow, the package 3 can be miniaturized. However, this is not limiting. W1≤W2 may be employed.

Molding Member

The molding member M molds the circuit board 8 and the vibration device 1 and protects these from moisture, dust, impact and the like. The molding member M is not particularly limited. For example, a thermosetting epoxy resin can be used and can mold by a transfer molding method. Although the molding member M is used in this embodiment, a metal lid having a recess may be coupled to the circuit board 8 and the vibration device may be accommodated inside the recess.

The vibration module 10 has been described above. The vibration device 1 included in such a vibration module 10 has: the lid substrate 5 as the first substrate including the bottom surface 51 as the first surface and the top surface 52 as the second surface opposite to the bottom surface 51; the base substrate 4 as the second substrate including the bottom surface 41 as the third surface and the top surface 42 as the fourth surface opposite to the bottom surface 41 and having the bottom surface 41 bonded to the top surface 52 to form the accommodation space S between the base substrate 4 and the lid substrate 5; the vibration element 2 accommodated in the accommodation space S; and the external coupling terminals 63, 64 arranged at the top surface 42 of the base substrate 4 and having the wire BW1 coupled thereto. The position where the wire BW1 is coupled is arranged in the area overlapping the bonding area R between the base substrate 4 and the lid substrate 5, as viewed in a plan view.

Since the positions P1, P2 where the wire BW1 is coupled are thus arranged in such away as to overlap the bonding area R, even when the capillary C is pressed against the external coupling terminals 63, 64 in order to couple the wire BW1 to the external coupling terminals 63, 64 and this applies a stress to the package 3, the package 3 is less likely to be damaged. When ultrasonic waves are used to couple the wire BW1 to the external coupling terminals 63, 64, the ultrasonic waves can be applied more efficiently to the wire coupling areas 631, 641 from the capillary C. This increases the bonding strength between the wire coupling areas 631, 641 and the wire BW1 and enables a more secure and firm coupling between these parts. Therefore, the electrical properties of the vibration module 10 are stabilized.

In the vibration device 1, the base substrate 4 and the lid substrate 5 are directly bonded together, as described above. Particularly, in this embodiment, the base substrate 4 and the lid substrate 5 are bonded together by the surface activated bonding method. Thus, the base substrate 4 and the lid substrate 5 can be bonded together at room temperature and this makes it less likely for the stress to remain on the package 3. Also, since the base substrate 4 and the lid substrate 5 can be bonded together without using a bonding member such as an adhesive or metal film, the height of the package 3 can be reduced.

As described above, the bonding area R has a rectangular frame-like shape surrounding the vibration element 2, as viewed in a plan view of the base substrate 4. The plurality of wire coupling areas 631, 641 overlapping one of the four extensions R1 to R4 along the respective sides of the bonding area R is arranged. In this embodiment, the wire coupling areas 631, 641 are arranged at the extension R2. Thus, it suffices to secure a space to arrange the wire coupling areas 631, 641 only at the extension R2 and there is no need to secure such a space at the other three extensions R1, R3, R4. Therefore, the width of the extensions R1, R3, R4 can be made narrower and the bonding area R can be made smaller.

As described above, the width W1 of the extension R2, where the plurality of wire coupling areas 631, 641 is arranged, is greater than the width W2 of the other three extensions R1, R3, R4. This increases the area overlapping the extension R2 and makes it easier to arrange the wire coupling areas 631, 641. Also, since the width W2 of the extensions R1, R3, R4 is narrow, the package 3 can be miniaturized.

As described above, the vibration module 10 has the vibration device 1 and the circuit board 8 as a module component to which the vibration device 1 is attached via the bottom surface 51 of the lid substrate 5. Therefore, the vibration module 10 can gain the effects of the vibration device 1. The vibration module 10 can be miniaturized and can achieve high reliability.

As described above, the vibration module 10 has the wire BW1 electrically coupling the circuit board 8 and the external coupling terminals 63, 64 together. Thus, the circuit board 8 and the vibration device 1 can be easily electrically coupled together. Also, since the external coupling terminals 63, 64 are arranged at the top surface of the package 3, the wire BW1 can be easily coupled to the external coupling terminals 63, 64.

Second Embodiment

Figure 9:
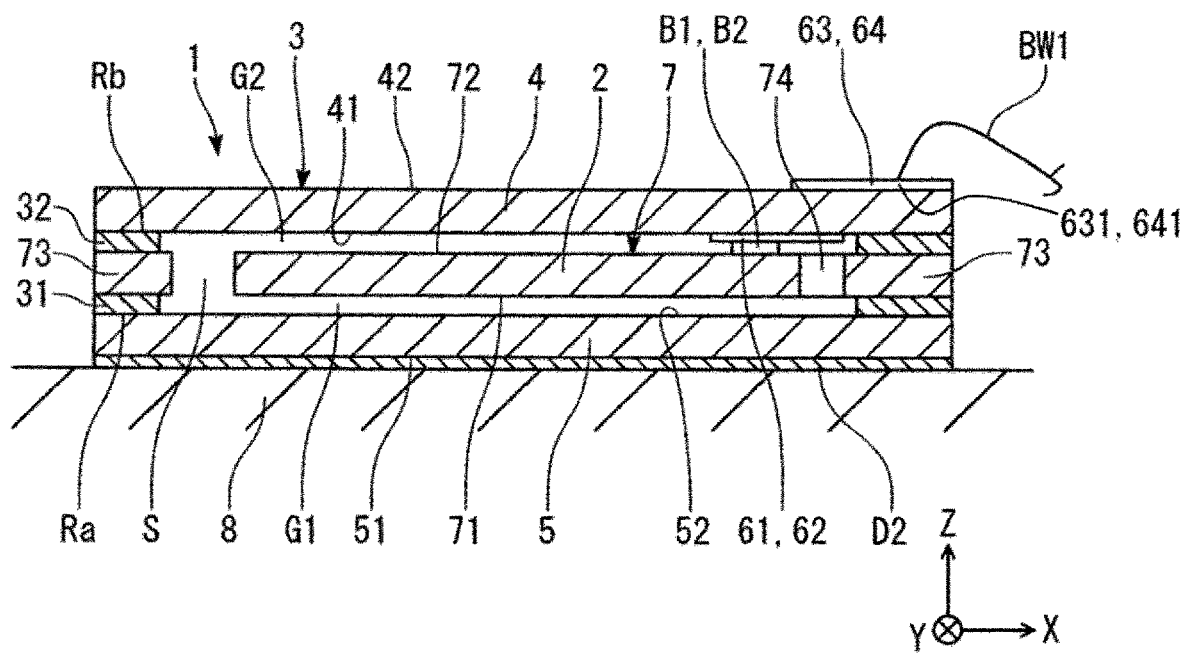
FIG. 9 is a cross-sectional view showing a vibration device according to a second embodiment.
Figure 10:
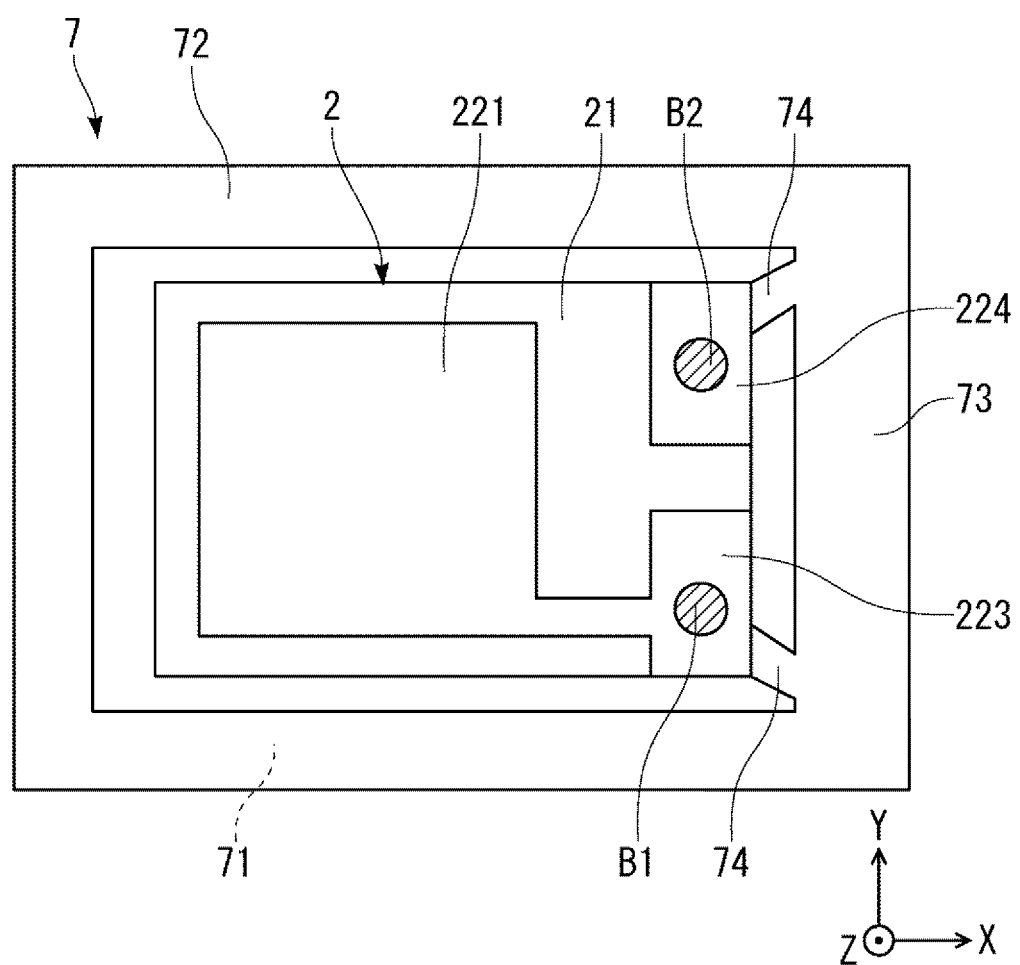
FIG. 10 is a plan view showing an intermediate substrate provided in the vibration device.
Figure 11:
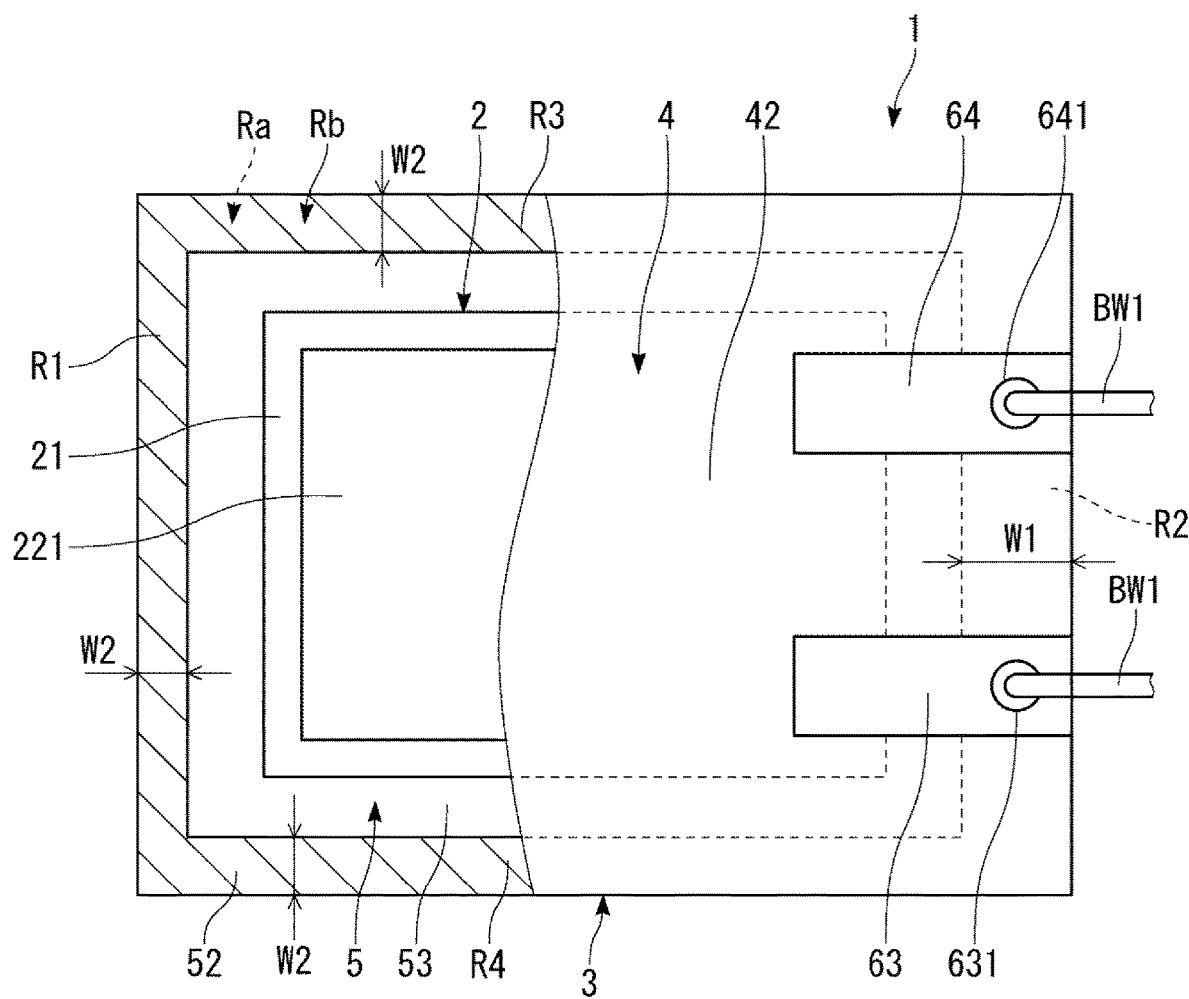
FIG. 11 is a plan view of the vibration device.
Figure 11:
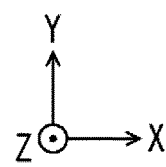

FIG. 9 is a cross-sectional view showing a vibration device according to a second embodiment. FIG. 10 is a plan view showing an intermediate substrate provided in the vibration device. FIG. 11 is a plan view of the vibration device.

The vibration module 10 according to this embodiment is similar to the vibration module 10 in the first embodiment, except that mainly the configuration of the vibration device 1 is different. In the description below, the vibration module 10 in the second embodiment is described in terms of the difference from the first embodiment and the description of similar matters is omitted. In FIGS. 9 to 11, configurations similar to those in the foregoing embodiment are denoted by the same reference signs.

The vibration device 1 shown in FIG. 9 has the base substrate 4, the lid substrate 5, and an intermediate substrate and is configured in such a way that the intermediate substrate 7 is provided between the base substrate 4 and the lid substrate 5. Each of the base substrate 4 and the lid substrate 5 has a plate-like shape. A plate-like substrate formed of a quartz crystal, silicon, or glass material for the base substrate 4 and the lid substrate 5. The intermediate substrate 7 has a plate-like shape including a bottom surface 71 as a fifth surface located on the side of the lid substrate 5 and a top surface 72 as a sixth surface at the side of the base substrate 4. A crystal quartz substrate formed of a quartz crystal material can be used for the intermediate substrate 7. As shown in FIG. 10, the intermediate substrate 7 also has the vibration element 2, a frame 73 surrounding the vibration element 2, and a coupler 74 coupling the vibration element 2 and the frame 73 together.

As shown in FIG. 9, the vibration device 1 has a first bonding member 31 located between the frame 73 and the lid substrate 5 and bonding together the bottom surface 71 of the frame 73 and the top surface 52 of the lid substrate 5, and a second bonding member 32 located between the frame 73 and the base substrate 4 and bonding together the top surface 72 of the frame 73 and the bottom surface 41 of the base substrate 4. In such a configuration, the base substrate 4, the lid substrate 5, and the frame 73 form the package 3, and the accommodation space S accommodating the vibration element 2 is formed inside the package 3. The bottom surface 51 of the lid substrate 5 of the package 3 is bonded to the circuit board 8 via the die attach member D2, as in the first embodiment.

The first bonding member 31 not only functions as a bonding member bonding the frame 73 and the lid substrate 5 together but also functions as a spacer forming a gap G1 between the vibration element 2 and the lid substrate 5. Similarly, the second bonding member 32 not only functions as a bonding member bonding the frame 73 and the base substrate 4 together but also functions as a spacer forming a gap G2 between the vibration element 2 and the base substrate 4. Using the first and second bonding members 31, 32 as spacers in this manner makes the configuration of the package 3 simpler.

The first and second bonding members 31, 32 are formed of a metal film. Specifically, the first bonding member 31 is formed by diffusion-bonding a metal film provided at the bottom surface 71 of the frame 73 and a metal film of the same type provided at the top surface 52 of the lid substrate 5. Similarly, the second bonding member 32 is formed by diffusion-bonding a metal film provided at the top surface 72 of the frame 73 and a metal film of the same type provided at the bottom surface 41 of the base substrate 4. Diffusion bonding can firmly bond the frame 73 and the lid substrate 5 together and the frame 73 and the base substrate 4 together. Other than diffusion bonding, anodic bonding can be used as the bonding method.

In the description below, the area where the lid substrate 5 and the frame 73 are bonded together is also referred to as a first bonding area Ra, and the area where the base substrate 4 and the frame 73 are bonded together is also referred to as a second bonding area Rb. As shown in FIG. 11, the first and second bonding areas Ra, Rb each have a rectangular frame-like shape surrounding the vibration element 2 and overlap each other, as viewed in a plan view of the base substrate 4.

The external coupling terminals 63, 64 are arranged at the top surface 42 of the base substrate 4. As shown in FIG. 11, the external coupling terminals 63, 64 have the wire coupling areas 631, 641 to which the wire BW1 is coupled. The position where the wire BW1 is coupled overlaps the first and second bonding areas Ra, Rb, as viewed in a plan view of the base substrate 4.

In such a configuration, the positions coupled to the wire BW1 in the external coupling terminals 63, 64 are located at sites where a rigid part made up of the base substrate 4, the frame 73, and the lid substrate 5 continuously laid over each other is arranged between these positions and the circuit board 8. That is, a gap such as the accommodation space S is not provided between the positions coupled to the wire BW1 and the circuit board 8. Therefore, as described in the first embodiment with reference to FIG. 8, even when the capillary C is pressed against the external coupling terminals 63, 64 in order to couple the wire BW1 to the external coupling terminals 63, 64, and this applies a stress to the package 3, the package 3 is less likely to be damaged. Also, even when the base substrate 4, the frame 73, and the lid substrate 5 are formed of a fragile material such as a silicon substrate, glass substrate or quartz crystal substrate, the package 3 is less likely to be damaged. When ultrasonic waves are used to couple the wire BW1 to the external coupling terminals 63, 64, the ultrasonic waves can be applied more efficiently to the wire coupling areas 631, 641 from the capillary C. This increases the bonding strength between the wire coupling areas 631, 641 and the wire BW1 and enables a more secure and firm coupling between these parts. Therefore, the electrical properties of the vibration module 10 are stabilized.

The wire coupling areas 631, 641 may be arranged preferably in an area overlapping the bonding area R, as viewed in a plan view of the base substrate 4. Such a configuration can achieve the state where a gap such as the accommodation space S is not provided between the wire coupling areas 631, 641 and the circuit board 8, over the entire wire coupling areas 631, 641. Therefore, even when the capillary C is pressed against the external coupling terminals 63, 64 and this applies a stress to the package 3, the package 3 is even less likely to be damaged.

The vibration device 1 in this embodiment has been described above. The vibration device 1 has the lid substrate 5 as the first substrate, the base substrate 4 as the second substrate, the intermediate substrate 7 arranged between the lid substrate 5 and the base substrate 4 and including the vibration element 2 and the frame 73 surrounding the vibration element 2, and the external coupling terminals 63, 64 arranged at the top surface 42 of the base substrate 4 and having the wire BW1 coupled thereto, as described above. The frame 73 has the bottom surface 71 bonded to the lid substrate 5 and has the top surface 72 bonded to the base substrate 4. The position where the wire BW1 is coupled is arranged within the area overlapping the first bonding area Ra, which is the bonding area between the lid substrate 5 and the frame 73, and the second bonding area Rb, which is the bonding area between the base substrate 4 and the frame 73, as viewed in a plan view.

Since the wire BW1 is coupled at the site overlapping the first and second bonding areas Ra, Rb in this way, even when the capillary C is pressed against the external coupling terminals 63, 64 in order to couple the wire BW1 to the external coupling terminals 63, 64 and this applies a stress to the package 3, the package 3 is less likely to be damaged. When ultrasonic waves are used to couple the wire BW1 to the external coupling terminals 63, 64, the ultrasonic waves can be applied more efficiently to the wire coupling areas 631, 641 from the capillary C. This increases the bonding strength between the wire coupling areas 631, 641 and the wire BW1 and enables a more secure and firm coupling between these parts. Therefore, the electrical properties of the vibration module 10 are stabilized.

As described above, the vibration device 1 has the first bonding member 31 located between the frame 73 and the lid substrate 5 and bonding the frame 73 and the lid substrate 5 together, and the second bonding member 32 located between the frame 73 and the base substrate 4 and bonding the frame 73 and the base substrate 4 together. Thus, the first bonding member 31 forms the gap G1 between the vibration element 2 and the lid substrate 5, and the second bonding member 32 forms the gap G2 between the vibration element 2 and the base substrate 4. As the first and second bonding members 31, 32 are also used as spacers in this manner, the configuration of the package 3 becomes simpler.

Third Embodiment

Figure 12:
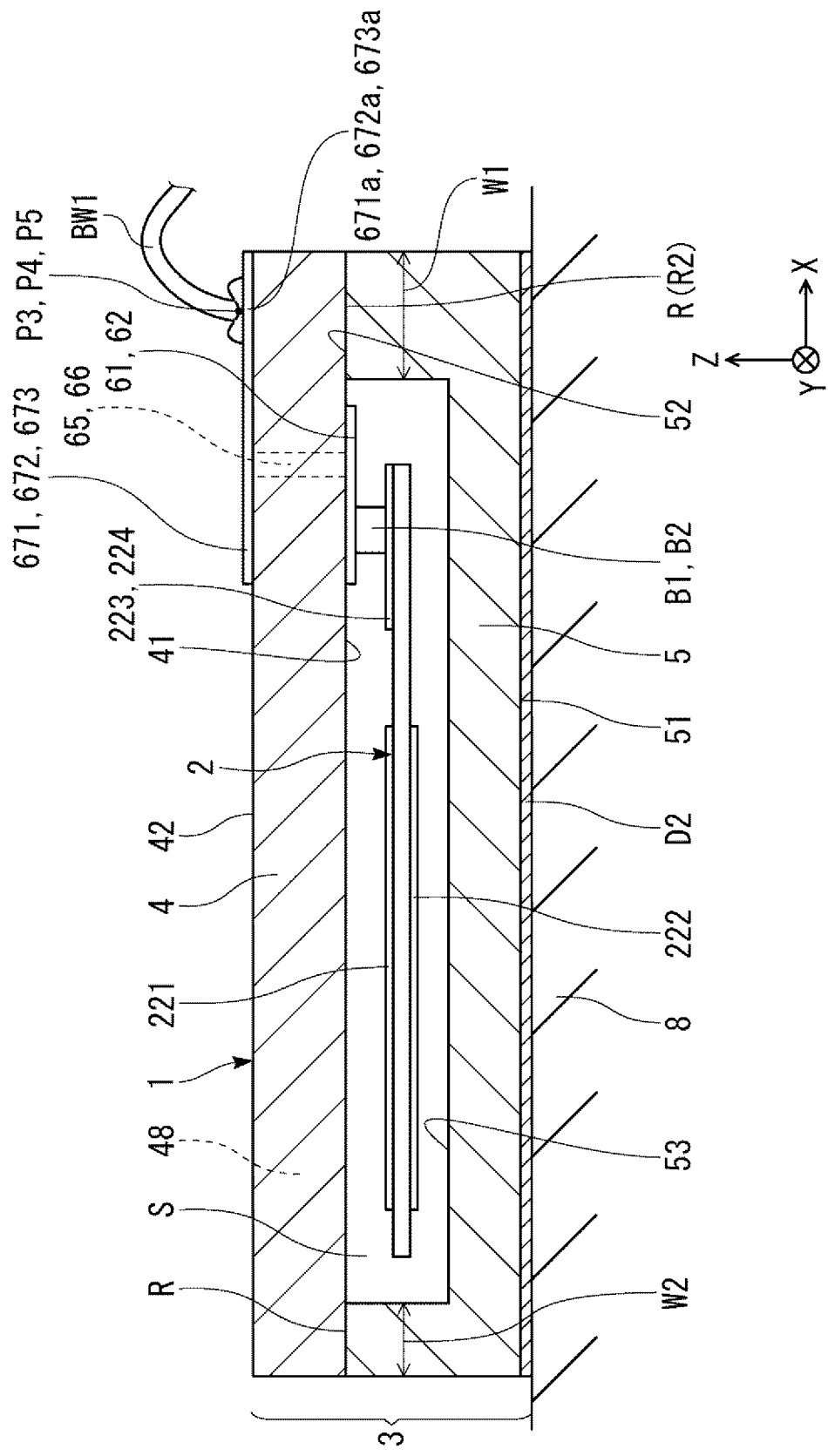
FIG. 12 is a cross-sectional view showing a vibration device according to a third embodiment.
Figure 13:
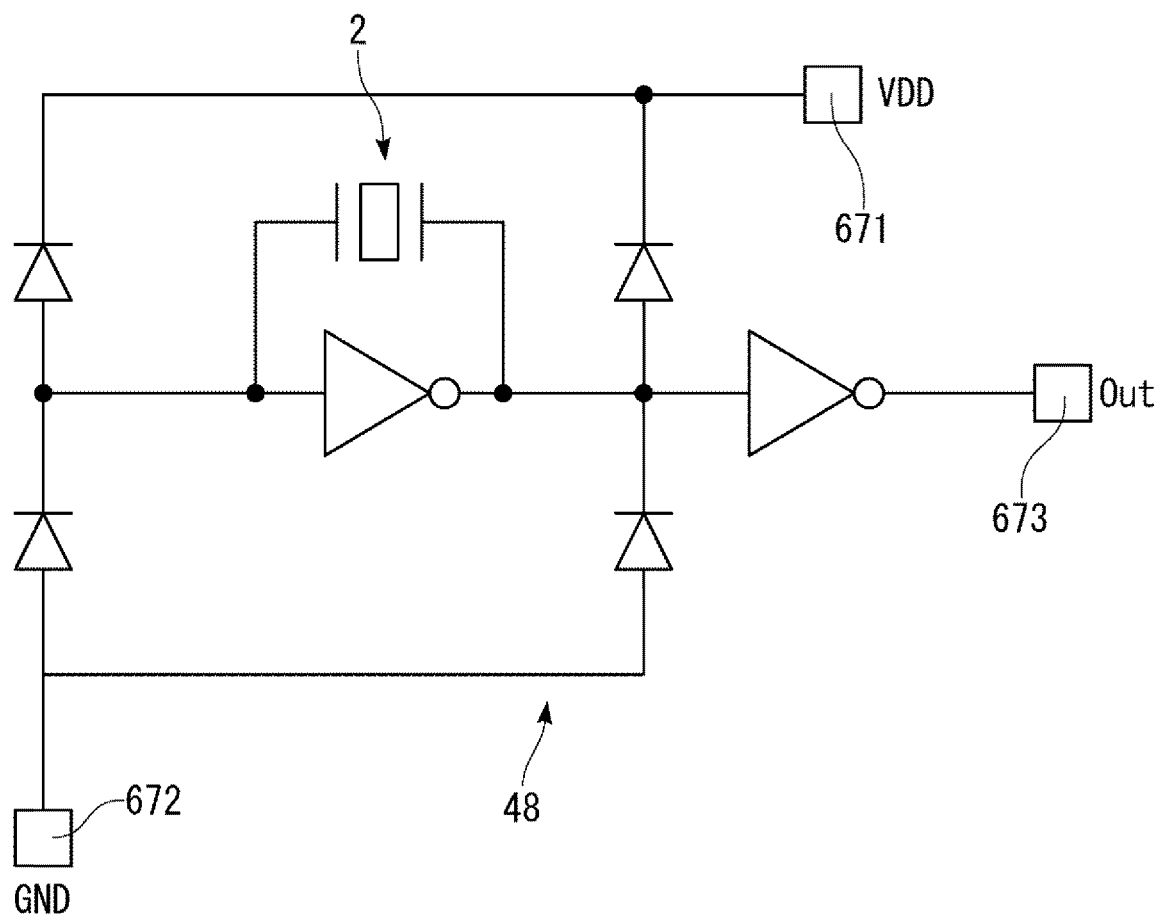
FIG. 13 is a circuit diagram showing an oscillation circuit.
Figure 14:
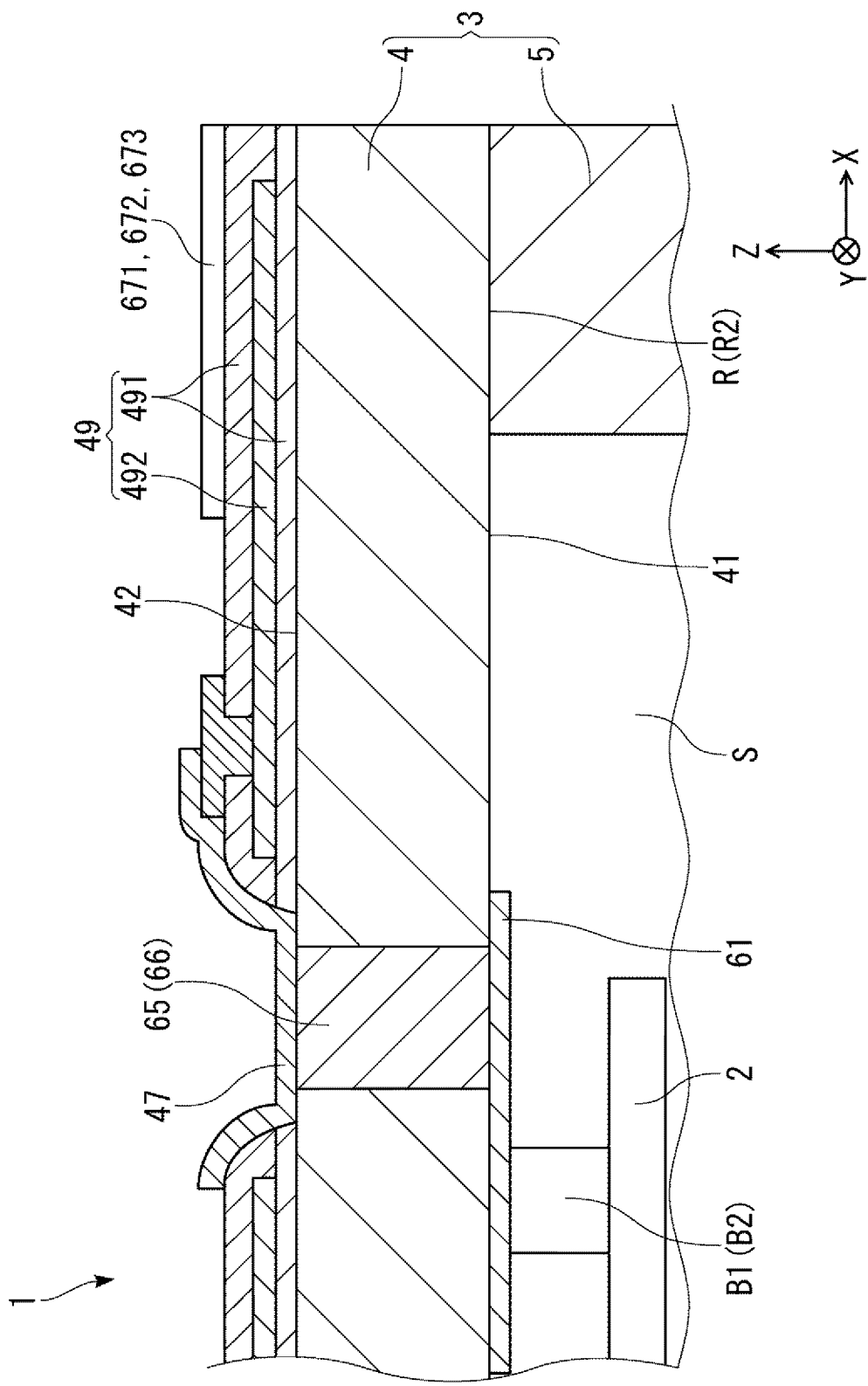
FIG. 14 is a cross-sectional view of a base substrate provided in the vibration device.
Figure 15:
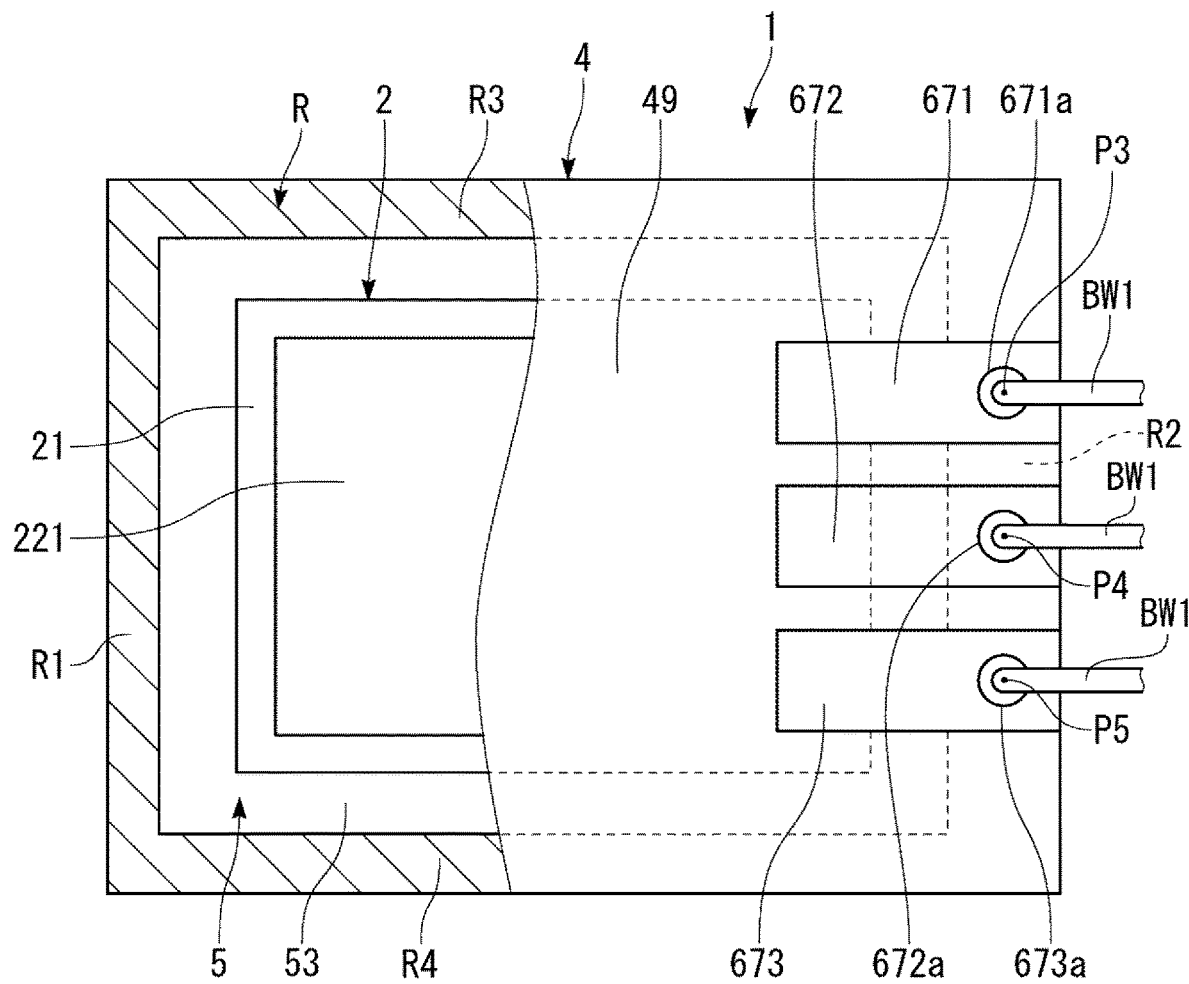
FIG. 15 is a plan view of the vibration device.

FIG. 12 is a cross-sectional view showing a vibration device according to a third embodiment. A multilayer member 49, described later, is stacked at the top surface 42 of the base substrate 4 but is omitted from FIG. 12 for the sake of description. FIG. 13 is a circuit diagram showing an oscillation circuit. FIG. 14 is a cross-sectional view of the base substrate provided in the vibration device. FIG. 15 is a plan view of the vibration device.

The vibration module 10 according to this embodiment is similar to the vibration module 10 in the first embodiment, except that mainly the configuration of the vibration device 1 is different. In the description below, the vibration module in the third embodiment is described in terms of the difference from the first embodiment and the description of similar matters is omitted. In FIGS. 12 to 15, configurations similar to those in the foregoing embodiments are denoted by the same reference signs.

As shown in FIG. 12, in the vibration device 1 in this embodiment, the base substrate 4 is formed of a semiconductor substrate such as a silicon substrate. The base substrate 4 includes the top surface 42. A circuit 48 electrically coupled to the vibration element 2 is formed on the side of the top surface 42 of the base substrate. In other words, the top surface 42 is an active surface. The circuit 48 may be, for example, an oscillation circuit causing the vibration element 2 to oscillate and thus generating a reference signal such as a clock signal, as shown in FIG. 13. Since the circuit 48 is formed at the base substrate 4 in this manner, the base substrate 4 forming a part of a package that airtightly seals the vibration element 2 can be effectively utilized and the vibration module 10 can be miniaturized. When the circuit 48 is formed at the base substrate 4, the oscillation circuit 83 can be omitted from the circuit board 8. Therefore, the circuit board 8 can be miniaturized.

As shown in FIG. 14, the multilayer member 49, made up of an insulating layer 491 and a wiring layer 492 stacked over each other, is provided at the top surface 42 of the base substrate 4, and a circuit element formed at the top surface 42 is coupled via the wiring layer 492, thus forming the circuit 48. As shown in FIG. 15, three external coupling terminals 671, 672, 673 electrically coupled to the circuit 48 are provided at a surface of the multilayer member 49. Of these, the external coupling terminal 671 is a terminal leading to a power supply. The external coupling terminal 672 is a terminal leading to the ground. The external coupling terminal 673 is a terminal where an oscillation signal from the circuit 48 is outputted. The number of external coupling terminals is not limited to three and may be changed according to need.

As shown in FIG. 15, the external coupling terminals 671, 672, 673 have wire coupling areas 671a, 672a, 673a where the wire BW1 is coupled. The external coupling terminals 671, 672, 673 are coupled to the wire BW1 at positions P3, P4, P5 of the wire coupling areas 671a, 672a, 673a. The positions P3, P4, P5 are arranged within an area overlapping the bonding area R, as viewed in a plan view of the base substrate 4. In this embodiment, the positions P3, P4, P5 are respectively the center positions of the wire coupling areas 671a, 672a, 673a. In this embodiment, the positions P3, P4, P5 are arranged particularly within an area overlapping the extension R2 of the bonding area R, as viewed in a plan view of the base substrate 4.

As shown in FIG. 14, the through electrodes 65, 66 are formed at apart that is not covered by the multilayer member 49, of the top surface 42 of the base substrate 4. Exposing apart of the top surface 42 from the multilayer member 49 makes it easier to form penetration holes to form the through electrodes 65, 66 in this part. A wiring 47 is provided over the top surface 42 of the base substrate 4 and the top surface of the multilayer member 49. The through electrodes 65, 66 and the circuit 48 are electrically coupled together via the wiring 47.

As described above, in the vibration device 1 in this embodiment, the base substrate 4 is a semiconductor substrate and has the circuit 48 as an oscillation circuit electrically coupled to the vibration element 2. Since the circuit 48 is formed at the base substrate 4 in this manner, the space of the base substrate 4 can be effectively utilized and the vibration module 10 can be miniaturized.

As described above, the top surface 42 of the base substrate 4 is the active surface. This makes it easier to form the external coupling terminals 671, 672, 673 at the outer surface of the package 3. Thus, the circuit 48 and the circuit board 8 can be coupled together easily.

Fourth Embodiment

Figure 16:
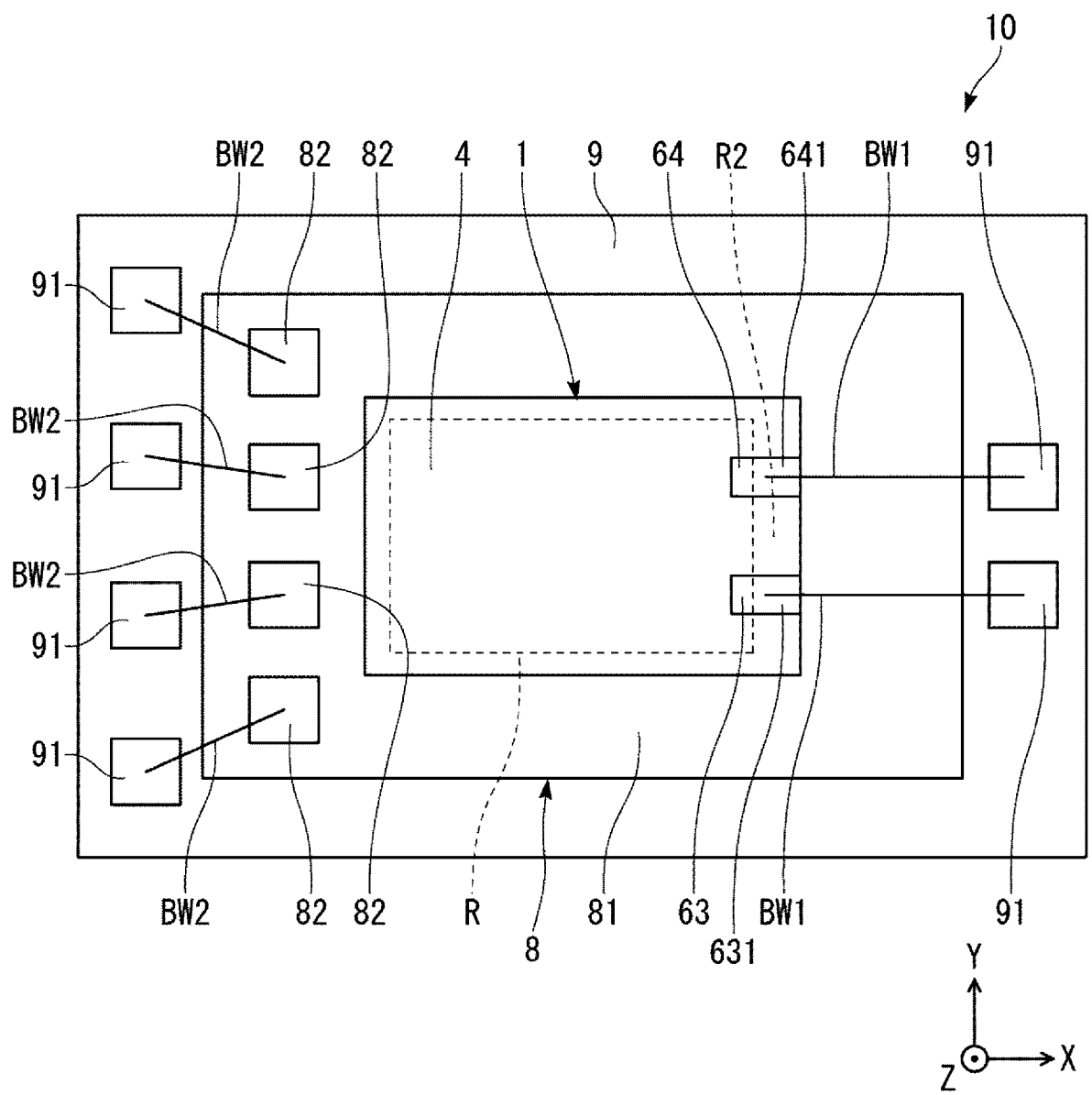
FIG. 16 is a plan view showing a vibration module according to a fourth embodiment.

FIG. 16 is a plan view showing a vibration module according to a fourth embodiment.

The vibration module 10 according to this embodiment is similar to the vibration module 10 in the first embodiment, except that the circuit board 8 and the vibration device 1 are electrically coupled together via the support substrate 9. In the description below, the vibration module 10 in the fourth embodiment is described in terms of the difference from the first embodiment and the description of similar matters is omitted. In FIG. 16, configurations similar to those in the foregoing embodiments are denoted by the same reference signs.

As shown in FIG. 16, the vibration module 10 in this embodiment, each of the external coupling terminals 63, 64 is electrically coupled via the wire BW1 to the coupling terminal 91 provided at the support substrate 9. That is, the external coupling terminals 63, 64 are electrically coupled to the circuit board 8 via the support substrate 9.

Fifth Embodiment

Figure 17:
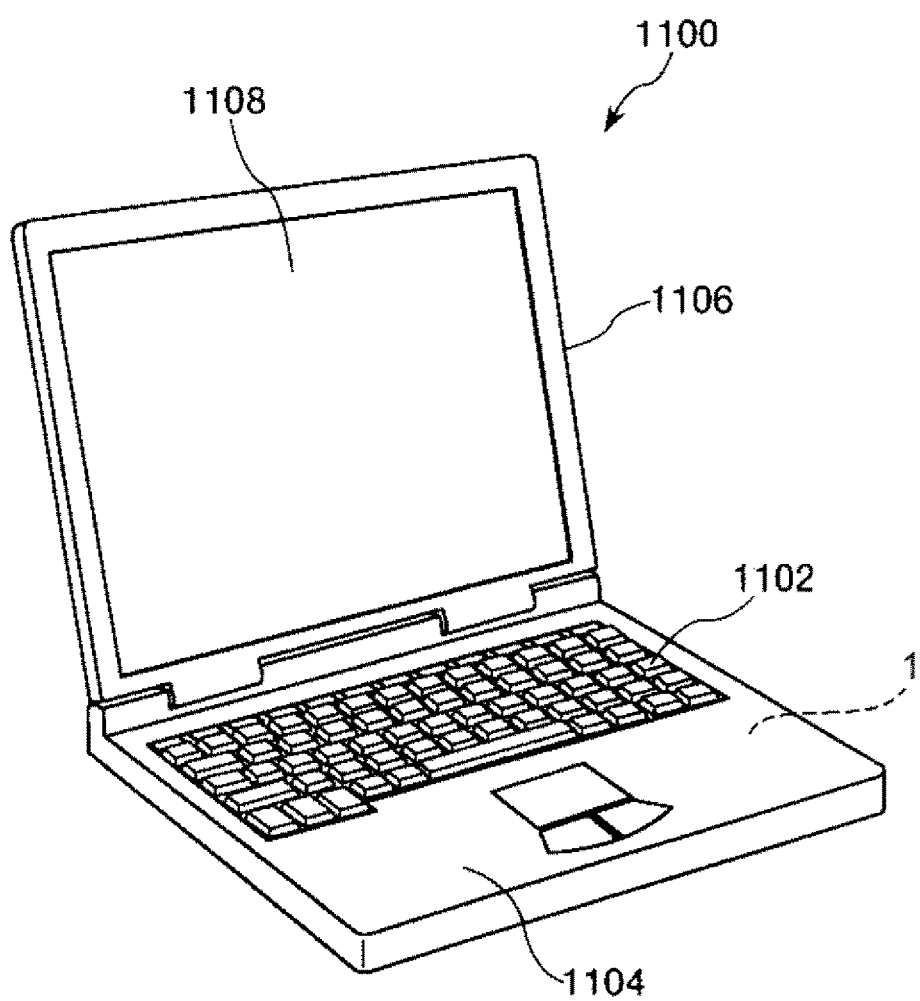
FIG. 17 is a perspective view showing an electronic apparatus according to a fifth embodiment.

FIG. 17 is a perspective view showing an electronic apparatus according to a fifth embodiment.

A laptop personal computer 1100 shown in FIG. 17 is an example to which an electronic apparatus having the vibration device in the embodiments described above is applied. In this illustration, the personal computer 1100 is made up of a main body 1104 having a keyboard 1102, and a display unit 1106 having a display 1108. The display unit 1106 is supported in such a way as to be able to pivot about the main body 1104 via a hinge structure. The vibration device 1 used as an oscillator, for example, is built in such a personal computer 1100.

The personal computer 1100 also has an arithmetic processing circuit performing arithmetic processing for control of the keyboard 1102 and the display 1108 or the like. The arithmetic processing circuit operates, based on an oscillation signal outputted from the oscillation circuit of the vibration device 1.

In this way, the personal computer 1100 as an electronic apparatus has the vibration device 1, and the arithmetic processing circuit operating, based on an oscillation signal outputted from the oscillation circuit of the vibration device 1. Therefore, the personal computer 1100 can gain the effects of the vibration device 1 and can achieve high reliability.

Sixth Embodiment

Figure 18:
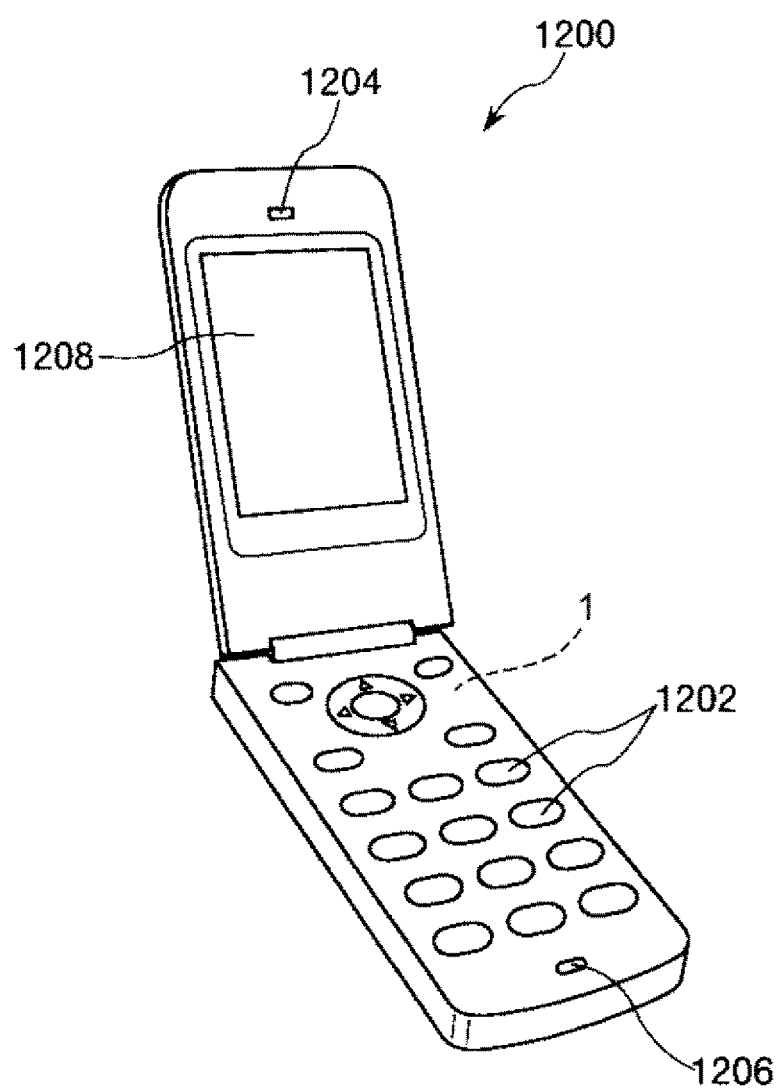
FIG. 18 is a perspective view showing an electronic apparatus according to a sixth embodiment.

FIG. 18 is a perspective view showing an electronic apparatus according to a sixth embodiment.

A mobile phone 1200 shown in FIG. 18 is an example to which an electronic apparatus having the vibration device in the embodiments described above is applied. The mobile phone 1200 has an antenna, a plurality of operation buttons 1202, a speaker 1204, and a microphone 1206. A display 1208 is arranged between the operation buttons 1202 and the speaker 1204. The vibration device 1 used as an oscillator, for example, is built in such a mobile phone 1200.

The mobile phone 1200 also has an arithmetic processing circuit performing arithmetic processing for control of the operation buttons 1202 or the like. The arithmetic processing circuit operates, based on an oscillation signal outputted from the oscillation circuit of the vibration device 1.

In this way, the mobile phone 1200 as an electronic apparatus has the vibration device 1, and the arithmetic processing circuit operating, based on an oscillation signal outputted from the oscillation circuit of the vibration device 1. Therefore, the mobile phone 1200 can gain the effects of the vibration device 1 and can achieve high reliability.

Seventh Embodiment

Figure 19:
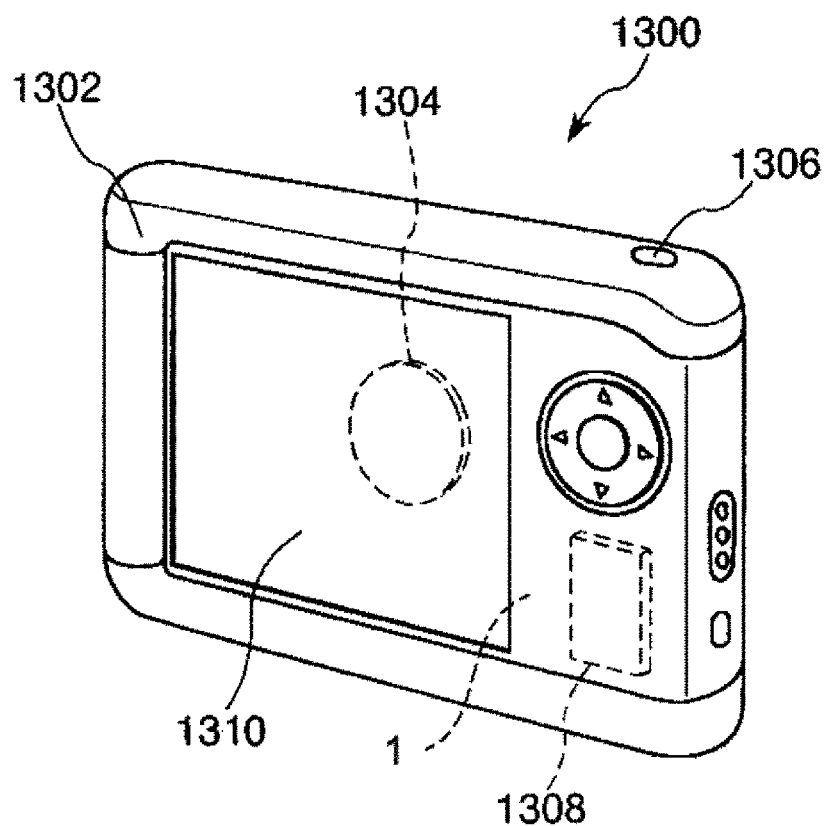
FIG. 19 is a perspective view showing an electronic apparatus according to a seventh embodiment.

FIG. 19 is a perspective view showing an electronic apparatus according to a seventh embodiment.

A digital still camera 1300 shown in FIG. 19 is an example to which an electronic apparatus having the vibration device in the embodiments described above is applied. A display 1310 is provided on the back side of a body 1302 and is configured to display an image based on a picked-up image signal from a CCD. The display 1310 also functions as a viewfinder showing a subject as an electronic image. On the front side (back side in the illustration) of the body 1302, a light receiving unit 1304 including an optical lens and a CCD or the like is provided. As a photographer checks a subject image displayed at the display 1310 and presses a shutter button 1306, a picked-up image from the CCD at that time is transferred to and stored into a memory 1308. The vibration device 1 used as an oscillator, for example, is built in such a digital still camera 1300.

The digital still camera 1300 also has an arithmetic processing circuit performing arithmetic processing for control of the display 1310 and the light receiving unit 1304 or the like. The arithmetic processing circuit operates, based on an oscillation signal outputted from the oscillation circuit of the vibration device 1.

In n this way, the digital still camera 1300 as an electronic apparatus has the vibration device 1, and the arithmetic processing circuit operating, based on an oscillation signal outputted from the oscillation circuit of the vibration device 1. Therefore, the digital still camera 1300 can gain the effects of the vibration device 1 and can achieve high reliability.

The electronic apparatus can not only be applied to the personal computer, the mobile phone, and the digital still camera, but also can be applied, for example, to a smartphone, tablet terminal, timepiece (including smartwatch), inkjet ejection device (for example, inkjet printer), desktop personal computer, television, wearable terminal such as HMD (head-mounted display), video camera, video tape recorder, car navigation device, pager, electronic organizer (including electronic organizer with communication functions), electronic dictionary, electronic calculator, electronic game device, word processor, workstation, videophone, security monitor, electronic binoculars, POS terminal, medical equipment (for example, electronic body thermometer, blood pressure monitor, blood sugar monitor, electrocardiograph, ultrasonic diagnostic device, electronic endoscope), fishfinder, various measuring devices, device for mobile terminal base station, instruments (for example, instruments of automobile, aircraft, ship), flight simulator, network server, and the like.

Eighth Embodiment

Figure 20:
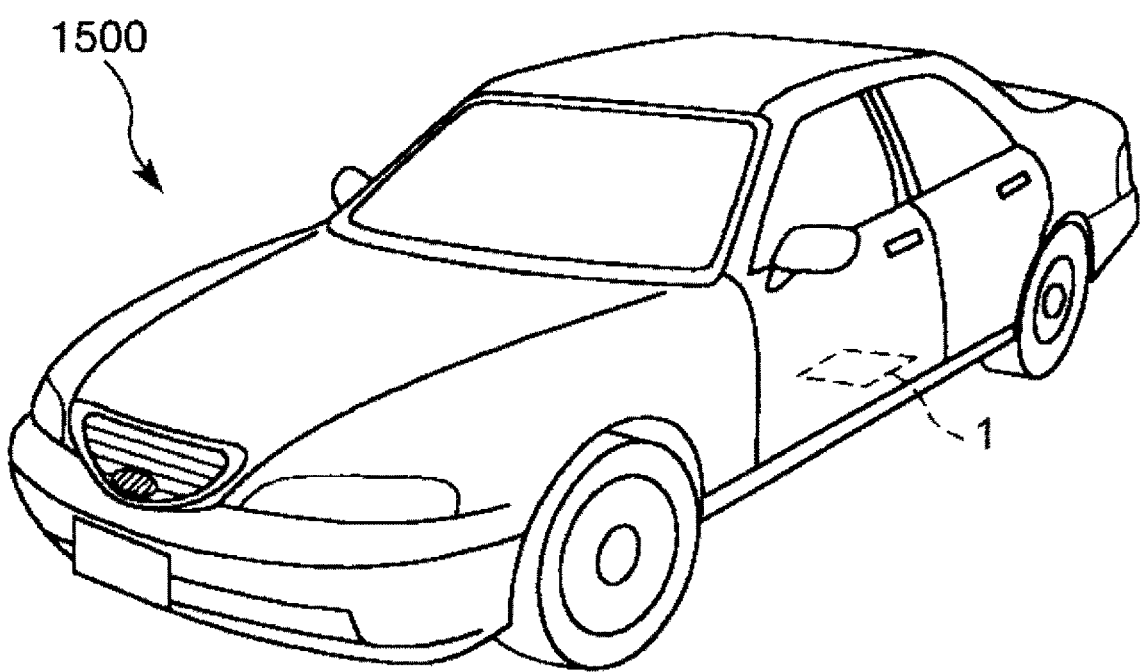
FIG. 20 is a perspective view showing a vehicle according to an eighth embodiment.

FIG. 20 is a perspective view showing a vehicle according to an eighth embodiment.

An automobile 1500 shown in FIG. 20 is an automobile to which a vehicle having the vibration device in the embodiments described above is applied. For example, the vibration device 1 used as an oscillator, and an arithmetic processing circuit operating, based on an oscillation signal outputted from the oscillation circuit of the vibration device 1, are built in the automobile 1500. Such vibration device 1 and arithmetic processing circuit can be broadly applied, for example, to a keyless entry system, immobilizer, car navigation system, car air-conditioning, anti-lock braking system (ABS), airbags, tire pressure monitoring system (TPMS), engine control, battery monitor for hybrid car or electric vehicle, and electronic control unit (ECU) such as vehicle attitude control system.

In this way, the automobile 1500 as a vehicle has the vibration device 1, and the arithmetic processing circuit operating, based on an oscillation signal outputted from the oscillation circuit of the vibration device 1. Therefore, the automobile 1500 can gain the effects of the vibration device 1 and can achieve high reliability.

The vehicle is not limited to the automobile 1500 and can also be applied, for example, to an aircraft, ship, AGV (automated guided vehicle), bipedal walking robot, unmanned aerial vehicle such as drone, and the like.

The vibration device, the vibration module, the electronic apparatus, and the vehicle have been described above, based on the illustrated embodiments. However, the present disclosure is not limited to these embodiments. The configuration of each part can be replaced by any configuration having a similar function. Also, any other arbitrary component may be added to the present disclosure. Moreover, any two or more configurations of the embodiments may be combined together.

What is claimed is:

1. A vibration device comprising:
   a first substrate including a first surface and a second surface opposite to the first surface;
   a second substrate including a third surface bonded to the second surface thereby forming an accommodation space between the first substrate and the second substrate, and a fourth surface opposite to the third surface;
   a vibration element accommodated in the accommodation space; and
   a first external coupling terminal arranged at the fourth surface, wherein the first external coupling terminal is coupled to a first wire at a first position that overlaps a bonding area between the first substrate and the second substrate, as viewed in a plan view.

2. The vibration device according to claim 1, wherein the first substrate and the second substrate are directly bonded together.

3. The vibration device according to claim 1, further comprising:
   a second external coupling terminal arranged at the fourth surface and having a second position to where a second wire to be coupled, wherein
   the bonding area has a rectangular frame-like shape with four extensions surrounding the vibration element, and
   the first position and the second position are within an area overlapping one extension of the four extensions, as viewed in the plan view.

4. The vibration device according to claim 3, wherein a width of the one extension is greater than a width of the other three extensions.

5. A vibration device comprising:
   a first substrate;
   a second substrate;
   an intermediate substrate arranged between the first substrate and the second substrate, the intermediate substrate including
     a vibration element, and
     a frame surrounding the vibration element and having one surface bonded to the first substrate and the other surface bonded to the second substrate; and
   a first external coupling terminal arranged at a surface of the second substrate, the surface being opposite to a surface at the side of the intermediate substrate, and having a first position to where a first wire to be coupled,
   the first external coupling terminal is coupled to the first wire at the first position that overlaps a bonding area between the first substrate and the frame and a bonding area between the second substrate and the frame, as viewed in a plan view.

6. The vibration device according to claim 5, further comprising:
   a first bonding member located between the frame and the first substrate and bonding the frame and the first substrate together; and
   a second bonding member located between the frame and the second substrate and bonding the frame and the second substrate together.

7. The vibration device according to claim 5, further comprising:
   a second external coupling terminal arranged at the surface opposite to the surface at the side of the intermediate substrate and having a second position to where a second wire to be coupled, wherein
   each of the bonding areas has a rectangular frame-like shape with four extensions surrounding the vibration element, and
   the first position and the second position are within an area overlapping one extension out of the four extensions of the respective bonding areas, as viewed in the plan view.

8. The vibration device according to claim 7, wherein a width of the one extension is greater than a width of the other three extensions.

9. The vibration device according to claim 1, wherein the second substrate is a semiconductor substrate and has an oscillation circuit electrically coupled to the vibration element.

10. The vibration device according to claim 9, wherein the oscillation circuit is arranged at the fourth surface.

11. The vibration device according to claim 8, wherein the second substrate is a semiconductor substrate and has an oscillation circuit electrically coupled to the vibration element.

12. The vibration device according to claim 11, wherein the oscillation circuit is arranged at the fourth surface.

13. A vibration module comprising:
    the vibration device according to claim 1; and
    a module component to which the vibration device is attached via the first surface.

14. The vibration module according to claim 13, further comprising:
    the first wire electrically coupling the module component and the external coupling terminal together.

15. An electronic apparatus comprising:
    the vibration device according to claim 9; and
    an processing circuit operating based on an oscillation signal outputted from the oscillation circuit.

16. A vehicle comprising:
    the vibration device according to claim 9; and
    an processing circuit operating based on an oscillation signal outputted from the oscillation circuit.

17. A vibration module comprising:
    the vibration device according to claim 5; and
    a module component to which the vibration device is attached via the first surface.

18. The vibration module according to claim 17, further comprising:
    the first wire electrically coupling the module component and the external coupling terminal together.

19. The vibration device according to claim 1, wherein the first position is a position where the first wire contacts an exterior surface of the first external coupling terminal.

20. The vibration device according to claim 1, wherein the second surface of the first substrate is directly bonded to the third surface of the second substrate.

* * * * *